(12) United States Patent
Herner et al.

(10) Patent No.: US 12,256,547 B2
(45) Date of Patent: Mar. 18, 2025

(54) SILICON OXIDE NITRIDE TUNNEL DIELECTRIC FOR A STORAGE TRANSISTOR IN A 3-DIMENSIONAL NOR MEMORY STRING ARRAY

(71) Applicant: SUNRISE MEMORY CORPORATION, San Jose, CA (US)

(72) Inventors: Scott Brad Herner, Portland, OR (US); Christopher J. Petti, Mountain View, CA (US); George Samachisa, Atherton, CA (US); Wu-Yi Henry Chien, San Jose, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 643 days.

(21) Appl. No.: 17/494,549

(22) Filed: Oct. 5, 2021

(65) Prior Publication Data

US 2022/0028871 A1 Jan. 27, 2022

Related U.S. Application Data

(63) Continuation-in-part of application No. 17/155,673, filed on Jan. 22, 2021, now Pat. No. 11,515,432.
(Continued)

(51) Int. Cl.
*H10B 43/35* (2023.01)
*G11C 16/04* (2006.01)
*H10B 43/20* (2023.01)

(52) U.S. Cl.
CPC ......... *H10B 43/35* (2023.02); *G11C 16/0483* (2013.01); *H10B 43/20* (2023.02)

(58) Field of Classification Search
CPC ..... H10B 43/35; H10B 43/20; G11C 16/0483
See application file for complete search history.

(56) References Cited

U.S. PATENT DOCUMENTS 7,465,980 B2 12/2008 Arimoto et al.
7,709,359 B2 5/2010 Boes et al.
(Continued)

FOREIGN PATENT DOCUMENTS

| CN | 101615618 A | * | 12/2009 | ................. C08F 2/32 |
| CN | 105575997 A | * | 5/2016 | ....... G02F 1/136286 |
| JP | 2004079606 A | | 3/2004 | |

OTHER PUBLICATIONS

Park, Goon-Ho , et al., "Electrical Characteristics of SiO2/High-k Dielectric Stacked Tunnel Barriers for Nonvolatile Memory Applications", Journal of the Korean Physical Society, vol. 55, No. 1, Jul. 2009, pp. 116-119.
(Continued)

*Primary Examiner* — Mohammad M Choudhry
(74) *Attorney, Agent, or Firm* — Edward C. Kwok; VLP Law Group LLP

(57) ABSTRACT

A thin-film storage transistor in a NOR memory string has a gate dielectric layer that includes a silicon oxide nitride (SiON) tunnel dielectric layer. In one embodiment, the SiON tunnel dielectric layer has a thickness between 0.5 to 5.0 nm thick and an index of refraction between 1.5 and 1.9. The SiON tunnel dielectric layer may be deposited at between 720° C. and 900° C. and between 100 and 800 mTorr vapor pressure, using an LPCVD technique under DCS, $N_2O$, and $NH_3$ gas flows. The SiON tunnel dielectric layer may have a nitrogen content of 1-30 atomic percent (at %).

18 Claims, 14 Drawing Sheets

Related U.S. Application Data

(60) Provisional application No. 62/992,754, filed on Mar. 20, 2020, provisional application No. 62/964,472, filed on Jan. 22, 2020.

(56) References Cited

U.S. PATENT DOCUMENTS

| | | | |
|---|---|---|---|
| 7,872,295 B2 | 1/2011 | Park et al. | |
| 7,898,009 B2 | 3/2011 | Wilson et al. | |
| 8,304,823 B2 | 11/2012 | Boescke | |
| 8,767,436 B2 | 7/2014 | Scalia et al. | |
| 9,053,801 B2 | 6/2015 | Sandhu et al. | |
| 9,053,802 B2 | 6/2015 | Mueller | |
| 9,219,225 B2 | 12/2015 | Karda et al. | |
| 9,231,206 B2 | 1/2016 | Tao et al. | |
| 9,263,577 B2 | 2/2016 | Ramaswamy et al. | |
| 9,281,044 B2 | 3/2016 | Ramaswamy et al. | |
| 9,337,210 B2 | 5/2016 | Karda et al. | |
| 9,362,487 B2 | 6/2016 | Inumiya et al. | |
| 9,391,084 B2 | 7/2016 | Lue | |
| 9,443,861 B1* | 9/2016 | Pachamuthu | H10B 43/27 |
| 9,472,560 B2 | 10/2016 | Ramaswamy et al. | |
| 9,530,794 B2 | 12/2016 | Ramaswamy et al. | |
| 9,558,804 B2 | 1/2017 | Mue | |
| 9,786,684 B2 | 10/2017 | Ramaswamy et al. | |
| 9,818,468 B2 | 11/2017 | Müller | |
| 9,818,848 B2 | 11/2017 | Sun et al. | |
| 9,830,969 B2 | 11/2017 | Slesazeck et al. | |
| 9,865,680 B2 | 1/2018 | Okumura et al. | |
| 9,875,784 B1 | 1/2018 | Li et al. | |
| 9,876,018 B2 | 1/2018 | Chavan et al. | |
| 9,941,299 B1 | 4/2018 | Chen et al. | |
| 10,038,092 B1 | 7/2018 | Chen et al. | |
| 10,043,567 B2 | 8/2018 | Slesazeck et al. | |
| 10,056,393 B2 | 8/2018 | Schroeder et al. | |
| 10,090,036 B2 | 10/2018 | Van Houdt | |
| 10,211,223 B2 | 2/2019 | Van Houdt et al. | |
| 10,211,312 B2 | 2/2019 | Van Houdt et al. | |
| 10,355,121 B2 | 7/2019 | Or-Bach et al. | |
| 10,403,627 B2 | 9/2019 | Van Houdt et al. | |
| 10,418,377 B2 | 9/2019 | Van Houdt et al. | |
| 10,424,379 B2 | 9/2019 | Slesazeck et al. | |
| 10,438,645 B2 | 10/2019 | Muell et al. | |
| 10,460,788 B2 | 10/2019 | Mueller | |
| 10,510,773 B2 | 12/2019 | Ramaswamy et al. | |
| 10,600,808 B2 | 3/2020 | Schröder et al. | |
| 10,622,051 B2 | 4/2020 | Mueller et al. | |
| 10,636,471 B2 | 4/2020 | Ramaswamy et al. | |
| 10,650,892 B2 | 5/2020 | Noack | |
| 10,651,182 B2 | 5/2020 | Morris et al. | |
| 10,700,093 B1 | 6/2020 | Kalitsov et al. | |
| 10,720,437 B2 | 7/2020 | Yoo | |
| 10,825,834 B1 | 11/2020 | Chen | |
| 10,872,905 B2 | 12/2020 | Muel | |
| 10,879,269 B1 | 12/2020 | Zhang et al. | |
| 10,896,711 B2 | 1/2021 | Lee et al. | |
| 10,937,482 B2 | 3/2021 | Sharma et al. | |
| 2006/0189154 A1 | 8/2006 | Ahn et al. | |
| 2007/0045711 A1* | 3/2007 | Bhattacharyya | H01L 29/42348 257/E21.21 |
| 2008/0032465 A1 | 2/2008 | Ahn et al. | |
| 2008/0054346 A1 | 3/2008 | Saitoh et al. | |
| 2009/0140318 A1 | 6/2009 | Dong | |
| 2011/0075486 A1* | 3/2011 | Liao | H10B 43/30 257/E21.409 |
| 2012/0146126 A1 | 6/2012 | Lai et al. | |
| 2013/0178031 A1* | 7/2013 | Ramkumar | H10B 43/40 257/E21.423 |
| 2014/0070290 A1 | 3/2014 | Inumiya et al. | |
| 2014/0355328 A1 | 12/2014 | Müller et al. | |
| 2016/0118404 A1 | 4/2016 | Peng | |
| 2017/0092371 A1 | 3/2017 | Harari | |
| 2018/0006044 A1 | 1/2018 | Chavan et al. | |
| 2018/0342527 A1* | 11/2018 | Yang | H10B 41/46 |
| 2019/0006015 A1 | 1/2019 | Norman et al. | |
| 2019/0043963 A1* | 2/2019 | Baars | H01L 29/66628 |
| 2019/0237470 A1 | 8/2019 | Mine et al. | |
| 2020/0065647 A1 | 2/2020 | Mulaosmanovic et al. | |
| 2020/0075631 A1 | 3/2020 | Dong | |
| 2020/0350324 A1 | 11/2020 | Hoffman | |
| 2020/0357453 A1 | 11/2020 | Slesazeck et al. | |
| 2020/0357455 A1 | 11/2020 | Noack et al. | |
| 2020/0357470 A1 | 11/2020 | Noack | |
| 2020/0388313 A1 | 12/2020 | Cho et al. | |
| 2020/0388711 A1 | 12/2020 | Doyle et al. | |
| 2020/0411533 A1 | 12/2020 | Alsmeier et al. | |
| 2021/0005238 A1 | 1/2021 | Mueller | |
| 2021/0020659 A1 | 1/2021 | Chen | |
| 2021/0066502 A1 | 3/2021 | Karda et al. | |
| 2021/0074725 A1 | 3/2021 | Lue | |
| 2021/0074726 A1 | 3/2021 | Lue | |
| 2021/0111179 A1 | 4/2021 | Shivaraman et al. | |

OTHER PUBLICATIONS

Tan, Yan-Ny , et al., "Over-Erase Phenomenon in SONOS-Type Flash Memory and its Minimization Using a Hafnium Oxide Charge Storage Layer", IEEE Transactions on Electron Devices, vol. 51, No. 7, Jul. 2004, pp. 1143-1147.

"Imec Demonstrates Capacitor-less IGZO-Based DRAM Cell With >400s Retention Time", IMEC, Press release, available at https://www.imec-int.com/en/press/imec-demonstrates-capacitor-less-igzo-based-dram-cell-400s-retention-time, Dec. 15, 2020, 15 pages.

Ahn, Min-Ju , et al., "Transparent multi-level-cell nonvolatile memory with dual-gate amorphous indiumgallium-zinc oxide thin-film transistors", Appl. Phys. Lett. 109, 252106; doi: 10.1063/1.4972961., 2016, 6 pages.

Alessandri, Cristobal , et al., "Monte Carlo Simulation of Switching Dynamics in Polycrystalline Ferroelectric Capacitors", IEEE Transactions on Electron Devices, vol. 66, No. 8, doi: 10.1109/TED.2019.2922268., Aug. 2019, pp. 3527-3534.

Ali, T. , et al., "A Multilevel FeFET Memory Device based on Laminated HSO and HZO Ferroelectric Layers for High-Density Storage", IEEE International Electron Devices Meeting (IEDM), 2019, doi: 10.1109/EDM19573.2019.8993642., Dec. 2019, pp. 28.7.1-28.7.4.

Ali, T. , et al., "High Endurance Ferroelectric Hafnium Oxide-Based FeFET Memory Without Retention Penalty,", IEEE Transactions on Electron Devices, vol. 65, No. 9, doi: 10.1109/TED.2018.2856818.— paper cited in Bae (Berkeley) paper, Sep. 2018, pp. 3769-3774.

Bae, Jong-Ho , et al., "Highly Scaled, High Endurance, Q-Gate, Nanowire Ferroelectric FET Memory Transistors", IEEE Electron Device Letters, vol. 41, No. 11, doi: 10.1109/LED.2020.3028339.— Sayeef-Berkeley paper on FeFET memory, Nov. 2020, pp. 1637-1640.

Beyer, Sven , et al., "FeFET: A versatile CMOS compatible device with game-changing potential", IEEE International Memory Workshop (IMW), doi: 10.1109/IMW48823.2020.9108150., 2020, pp. 1-4.

Böscke, T.S. , et al., "Ferroelectricity in hafnium oxide: CMOS compatible ferroelectric field effect transistors", 2011 International Electron Devices Meeting, Washington, DC, USA, doi: 10.1109/IEDM.2011.6131606., 2011, pp. 24.5.1-24.5.4.

Chang, Sou-Chi , et al., "Anti-ferroelectric HfxZr1—xO2 Capacitors for High-density 3-D Embedded-DRAM", IEEE International Electron Devices Meeting (IEDM), doi: 10.1109/IEDM13553.2020.9372011., 2020, p. 28.1.1-28.1.4.

Cho, Min Hoe, et al., "Achieving a Low-Voltage, High-Mobility IGZO Transistor through an ALD-Derived Bilayer Channel and a Hafnia-Based Gate Dielectric Stack", ACS Applied Materials & Interfaces, Apr. 1, 2021, 13 (14), , DOI: 10.1021/acsami.0c22677, 2021, pp. 16628-16640.

Cho, Min Hoe, et al., "Comparative Study on Performance of IGZO Transistors With Sputtered and Atomic Layer Deposited Channel Layer", IEEE Transactions on Electron Devices, vol. 66, No. 4, doi: 10.1109/TED.2019.2899586., Apr. 2019, pp. 1783-1788.

(56) References Cited

OTHER PUBLICATIONS

Choi, Seonjun, et al., "A novel three-dimensional NAND flash structure for improving the erase performance", IEICE Electronics Express, 2019 vol. 16 Issue 3, 2019, 6 pages.

De, Sourav, et al., "Ultra-Low Power Robust 3bit/cell Hf0.5Zr0.5O2 Ferroelectric FinFET with High Endurance for Advanced Computing-In-Memory Technology", 2021 Symposium on VLSI Technology, Kyoto, Japan, Jun. 13-19, 2021, Jun. 2021, 2 pages.

Dünkel, "A FeFET based super-low-power ultra-fast embedded NVM technology for 22nm FDSOI and beyond", IEEE International Electron Devices Meeting (IEDM), San Francisco, CA, USA, 2017, doi: 10.1109/IEDM.2017.8268425., 2017, pp. 19.7.1-19.7.4.

Dutta, Sourav, et al., "Logic Compatible High-Performance Ferroelectric Transistor Memory", available at https://arxiv.org/abs/2105.11078, Department of Electrical Engineering, University of Notre Dame, Notre Dame, IN 46556, USA, May 24, 2021, 28 pages.

Florent, K., "First demonstration of vertically stacked ferroelectric Al doped HfO2 devices for NAND applications", Symposium on VLSI Technology, doi: 10.23919/VLSIT.2017.7998162., 2017, pp. T158-T159.

Florent, K., et al., "Vertical Ferroelectric HfO2 FET based on 3-D NAND Architecture: Towards Dense Low-Power Memory", IEEE International Electron Devices Meeting (IEDM), San Francisco, CA, 2018, doi: 10.1109/IEDM.2018.8614710., 2018, pp. 2.5.1-2.5.4.

Hendy, Ian, "The Role of Increased Semiconductor Mobility—an IGZO Case Study", Display Daily, available at https://www.displaydaily.com/article/display-daily/the-role-of-increased-semiconductor-mobility-an-igzo-case-study, Apr. 2021, 11 pages.

Hsain, Hanan Alexandra, et al., "Many routes to ferroelectric HfO2: A review of current deposition methods", J. Vac. Sci. Technol. A 40, 010803 (2022), published Dec. 1, 2021., Dec. 1, 2021, pp. 010803-1-010803-36.

Jeewandara, Thamarasee, et al., "High-speed 3-D memory with ferroelectric NAND flash memory", available at https://techxplore.com/news/2021-01-high-speed-d-memoryferroelectric-nand.html, Jan. 26, 2021, 5 pages.

Kawai, H., et al., "Design Principle of Channel Material for Oxide Semiconductor Field-Effect Transistor with High Thermal Stability and High On-current by Fluorine Doping", IEEE International Electron Devices Meeting (IEDM), doi: 10.1109/IEDM13553.2020.9372121., 2020, pp. 22.2.1-22.2.4.

Kim, Min-Kyu, et al., "CMOS-compatible ferroelectric NAND flash memory for high-density, low-power, and high-speed three-dimensional memory", Science Advances, vol. 7, No. 3, eabe 1341, DOI: 10.1126/sciadv.abe1341. (Replacement of polysilicon channel material—use IZO for channel), Jan. 13, 2021, 10.

Kim, Taeho, et al., "Effects of high pressure nitrogen annealing on ferroelectric Hf0.5Zr0.5O2 films", Appl. Phys. Lett. 112, 092906 https://doi.org/10.1063/1.5003369, Mar. 2, 2018, 5 pages.

Kunitake, Hitoshi, et al., "High-temperature Electrical Characteristics of 60nm CAAC-IGZO FET : Comparison with Si FET", International Conference on Solid State Devices and Materials, https://doi.org/10.7567/SSDM.2018. N-3-04, Sep. 2018, pp. 787-788.

Lee, Sang Yeol, "Comprehensive Review on Amorphous Oxide Semiconductor Thin Film Transistor", Trans. Electr. Electron. Mater. 21, https://doi.org/10.1007/s42341-020-00197-w, Mar. 28, 2020, pp. 235-248.

Lee, Chea-Young, et al., "Etching Characteristics and Changes in Surface Properties of IGZO Thin Films by O2 Addition in CF4/Ar Plasma", Coatings. 2021, 11(8):906. https://doi.org/10.3390/coatings11080906, Jul. 29, 2021.

Liao, P.J., et al., "Characterization of Fatigue and Its Recovery Behavior in Ferroelectric HfZrO", 2021 Symposium on VLSI Technology, Jun. 2021, 2 p.

Liao, C.Y., et al., "Multibit Ferroelectric FET Based on Nonidentical Double HfZrO2 for High-Density Nonvolatile Memory", IEEE Electron Device Letters, vol. 42, No. 4, doi: 10.1109/LED.2021.3060589., Apr. 2021, pp. 617-620.

Materano, Monica, et al., "Interplay between oxygen defects and dopants: effect on structure and performance of HfO2-based ferroelectrics", Inorg. Chem. Front. (8), Apr. 9, 2021, pp. 2650-2672.

Mo, Fei, et al., "Experimental Demonstration of Ferroelectric HfO2 FET with Ultrathin-body IGZO for High-Density and Low-Power Memory Application", 2019 Symposium on VLSI Technology, 3, doi: 10.23919/VLSIT.2019.8776553., 2019, pp. T42-T4.

Mo, Fei, et al., "Low-Voltage Operating Ferroelectric FET with Ultrathin IGZO Channel for High-Density Memory Application", IEEE Journal of the Electron Devices Society, vol. 8, doi: 10.1109/JEDS.2020.3008789., Jul. 13, 2020, pp. 717-723.

Mueller, S., et al., "Development Status of Gate-First FeFET Technology", 2021 Symposium on VLSI Technology, Jun. 2021, 2 pages.

Mueller, J., et al., "Ferroelectric Hafnium Oxide Based Materials and Devices: Assessment of Current Status and Future Prospects", ECS Journal of Solid State Science and Technology, 4 (5) N30-N35 (2015), Feb. 21, 2015, pp. N29-N35.

Mueller, J., et al., "Ferroelectric hafnium oxide: A CMOS-compatible and highly scalable approach to future ferroelectric memories", IEEE International Electron Devices Meeting, Washington, DC, USA, doi: 10.1109/IEDM.2013.6724605., 2013, pp. 10.8.1-10.8.4.

Mueller, Stephen, et al., "From MFM Capacitors Toward Ferroelectric Transistors: Endurance and Disturb Characteristics of HfO2-Based FeFET Devices", IEEE Transactions on Electron Devices, vol. 60, No. 12, doi: 10.1109/TED.2013.2283465., Dec. 2013, pp. 4199-4205.

Müller, J., et al., "Ferroelectric hafnium oxide: A CMOS-compatible and highly scalable approach to future ferroelectric memories", 2013 IEEE International Electron Devices Meeting, Washington, DC, USA, doi: 10.1109/IEDM.2013.6724605., 2013, pp. 10.8.1-10.8.4.

Nguyen, Manh-Cuong, et al., "Wakeup-Free and Endurance-Robust Ferroelectric Field-Effect Transistor Memory Using High Pressure Annealing", IEEE Electron Device Letters, vol. 42, No. 9, doi: 10.1109/LED.2021.3096248., Sep. 2021, pp. 1295-1298.

On, Nuri, et al., "Boosting carrier mobility and stability in indium-zinc-tin oxide thin-film transistors through controlled crystallization", Sci Rep 10, 18868, https://doi.org/10.1038/s41598-020-76046-w, 2020, 16 pages.

Onuki, Tatsuya, et al., "Embedded memory and ARM Cortex-M0 core using 60-nm C-axis aligned crystalline Indium-gallium-zinc oxide FET integrated with 65-nm Si CMOS", IEEE Journal of Solid-State Circuits, vol. 52, No. 4,, Apr. 2017, pp. 925-932.

Park, Min Hyuk, et al., "Review of defect chemistry in fluorite-structure ferroelectrics for future electronic devices", J. Mater. Chem. C, vol. 8, No. 31 10526-10550, Jun. 9, 2020., Aug. 21, 2020, p. 10526-10550.

Rios, Rafael, et al., "A Physically Based Compact Model for IGZO Transistors", IEEE Transactions on Electron Devices, vol. 68, No. 4, doi: 10.1109/TED.2021.3059387., Apr. 2021, pp. 1664-1669.

Rzehak, Volker, "Low-Power FRAM Microcontrollers and Their Applications", Texas Instruments White Paper, SLAA502, Jul. 2019, 7 pages.

Saitoh, Masumi, et al., "HfO2-based FeFET and FTJ for Ferroelectric-Memory Centric 3D LSI towards Low-Power and High-Density Storage and AI Applications", 2020 IEEE International Electron Devices Meeting (IEDM), doi: 10.1109/IEDM13553.2020.9372106., 2020, pp. 18.1.1-18.1.4.

Salahuddin, Sayeef, et al., "FeFETs for Near-Memory and In-Memory Compute", 2021 IEEE International Electron Devices Meeting (IEDM), Department of Electrical Engineering and Computer Sciences, Dec. 2021, 4 pages.

Sharma, Abhishek A., et al., "High Speed Memory Operation in Channel-Last, Back-gated Ferroelectric Transistors", IEEE International Electron Devices Meeting (IEDM), doi: 10.1109/IEDM13553.2020.9371940., 2020, pp. 18.5.1-18.5.4.

Sheng, Jiazhen, et al., "Review Article: Atomic layer deposition for oxide semiconductor thin film transistors: Advances in research and development", J. Vac. Sci. Technol. A 36, 060801, https://doi.org/10.1116/1.5047237., Nov. 2, 2018, 14 pages.

(56) References Cited

OTHER PUBLICATIONS

Si, Mengwei, et al., "Why In2O3 Can Make 0.7 nm Atomic Layer Thin Transistors?", available at https://arxiv.org/ftp/arxiv/papers/2012/2012.12433.pdf, School of Electrical and Computer Engineering and Birck Nanotechnology Center, Purdue University, West Lafayette, IN 47907, United States, 2012, pp. 1-26.

Su, Nai-Chao, et al., "A Nonvolatile InGaZnO Charge-Trapping-Engineered Flash Memory With Good Retention Characteristics", IEEE Electron Device Letters, vol. 31, No. 3, Mar. 2010, pp. 201-203.

Sun, Chen, "First Demonstration of BEOL-Compatible Ferroelectric TCAM Featuring a-IGZO Fe-TFTs with Large Memory Window of 2.9 V, Scaled Channel Length of 40 nm, and High Endurance of $10^{\wedge}8$ Cycles", 2021 Symposium on VLSI Technology Digest of Technical Papers, Kyoto, doi: 978-4-86348-779-6., Jun. 2021, 2 pages.

Tan, Ava J., et al., "A Nitrided Interfacial Oxide for Interface State Improvement in Hafnium Zirconium Oxide-Based Ferroelectric Transistor Technology", IEEE Electron Device Letters, vol. 39, No. 1, doi: 10.1109/LED.2017.2772791., Jan. 2018, pp. 95-98.

Tan, Ava J., et al., "Experimental Demonstration of a Ferroelectric HfO2-Based Content Addressable Memory Cell", IEEE Electron Device Letters, vol. 41, No. 2, doi: 10.1109/LED.2019.2963300., Feb. 2020, pp. 240-243.

Tan, Ava Jiang, et al., "Ferroelectric HfO2 Memory Transistors with High-κ Interfacial Layer and Write Endurance Exceeding 1010 Cycles", arXiv:2103.08806 [physics.app-ph], available at https://arxiv.org/abs/2103.08806., Mar. 16, 2021.

Tan, Ava J., et al., "Hot Electrons as the Dominant Source of Degradation for Sub-5nm HZO FeFETs", IEEE Symposium on VLSI Technology, Honolulu, HI, USA, doi: 10.1109/VLSITechnology18217.2020.9265067., 2020, pp. 1-2.

Van Houdt, Jan, "The 3D FeFET: contender for 3D-NAND Flash memory and machine learning", available at https://www.imecint.com/en/imec-magazine/imec-magazine-october-2017/the-vertical-ferroelectric-fet-a-new-contender-for-3d-nand-flash-memory-and-machine-learning, Sep. 30, 2019, 8 pages.

Yang, Jin, et al., "Highly Optimized Complementary Inverters Based on p-SnO and n-InGaZnO With High Uniformity", IEEE Electron Device Letters, vol. 39, No. 4, doi: 10.1109/LED.2018.2809796., Apr. 2018, pp. 516-519.

\* cited by examiner

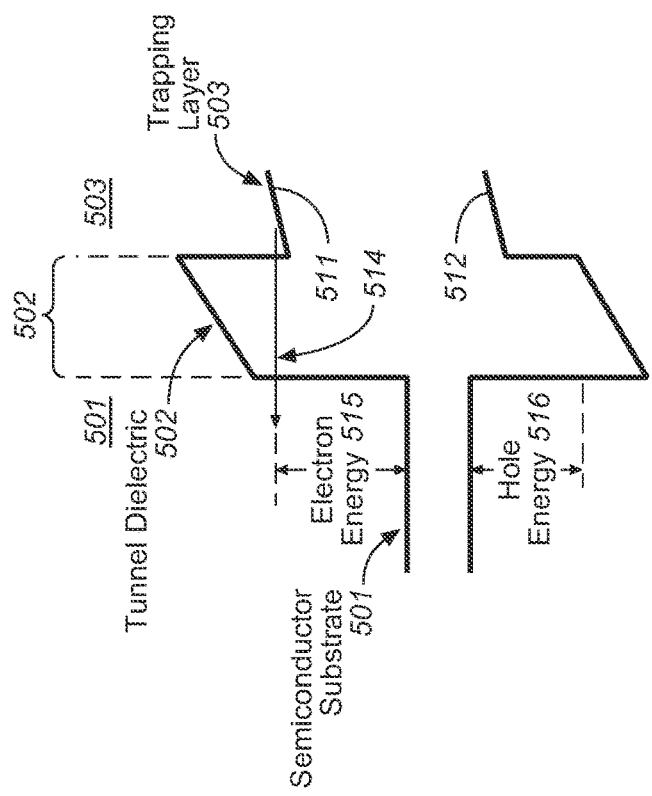
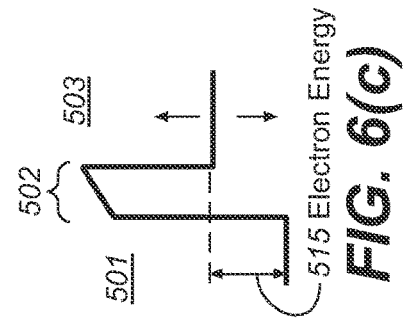
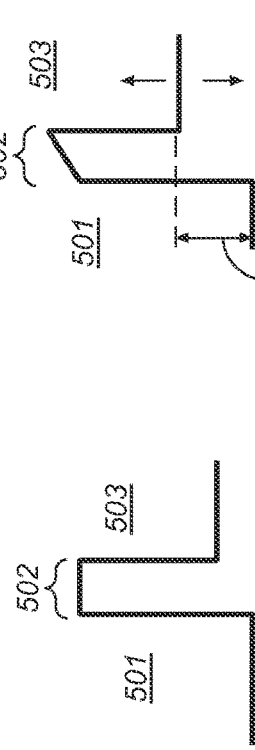
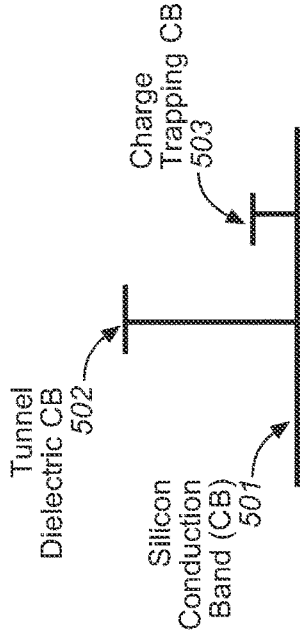
FIG. 5
FIG. 6(a)
FIG. 6(b)
FIG. 6(c)

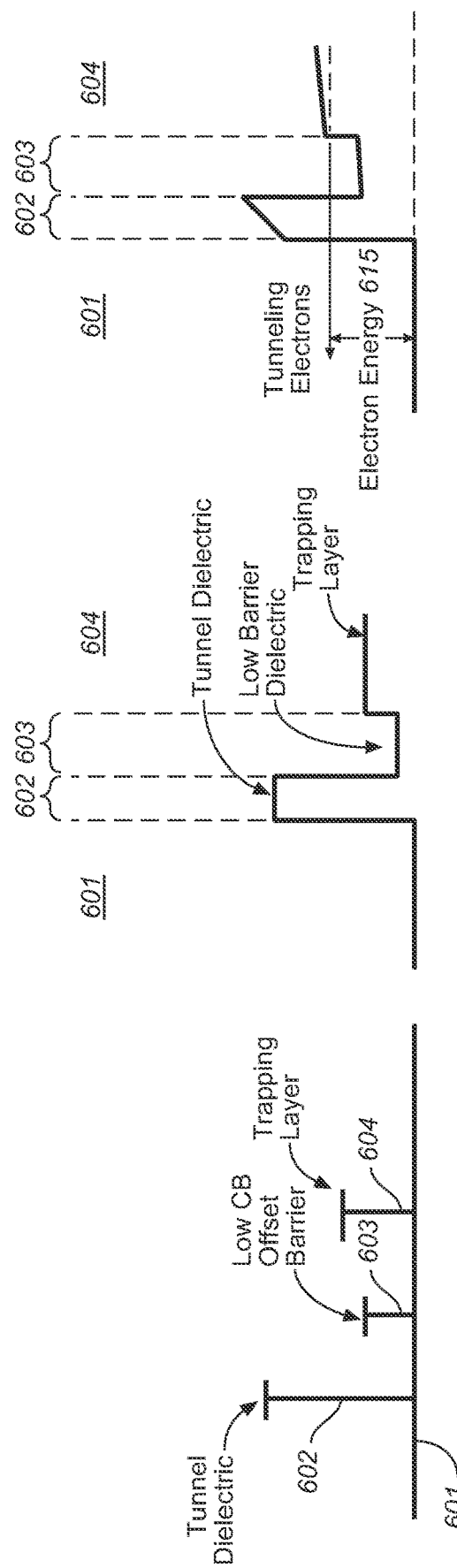

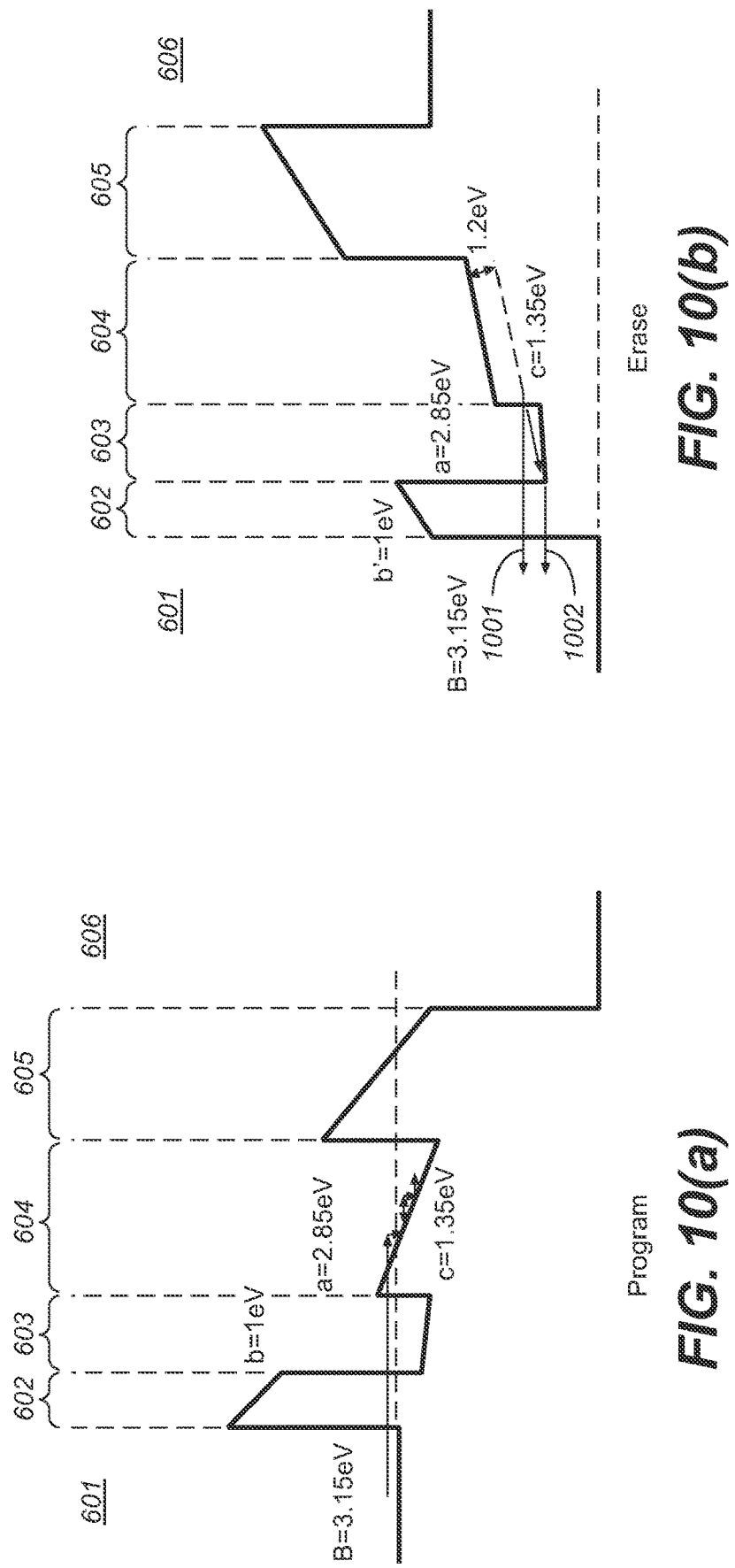

SILICON OXIDE NITRIDE TUNNEL DIELECTRIC FOR A STORAGE TRANSISTOR IN A 3-DIMENSIONAL NOR MEMORY STRING ARRAY

CROSS REFERENCE TO RELATED APPLICATIONS

The present application is a continuation-in-part patent application of U.S. patent application ("Parent Application"), Ser. No. 17/155,673, entitled 'Cool Electrons Erasing In Thin-film Storage Transistors," filed on Jan. 22, 2021, which is related to and which claims priority of: (i) U.S. provisional patent application ("Provisional Application I"), Ser. No. 62/964,472, entitled "Cool Electron Erasing In Thin-film Storage Transistors," filed on Jan. 22, 2020, and (ii) U.S. provisional patent application ("Provisional Application II"), Ser. No. 62/992,754, entitled "Cool Electron Erasing In Thin-film Storage Transistors," filed on Mar. 20, 2020. The disclosures of the Parent Application and the Provisional Applications I and II are hereby incorporated by reference in their entireties.

BACKGROUND OF THE INVENTION

1. Field of the Invention

The present invention relates to a silicon oxide nitride (SiON) tunnel dielectric layer for a storage transistor. In particular, the present invention relates to a SiON tunnel dielectric layer in gate dielectric layers of storage transistors, such as the storage transistors in 3-Dimensional NOR memory string arrays, and methods for its manufacturing.

2. Discussion of the Related Art

U.S. Patent Application Publication 2019/0006015 (the "'015 Publication"), entitled "Capacitive-Coupled Non-Volatile Thin-Film Transistor Strings in Three-Dimensional Arrays," published on Jan. 3, 2019, discloses thin-film storage transistors organized as NOR memory strings. Thin-film transistors in the '015 Publication may be programmed and erased in 100 nanosecond (ns) or less, rendering them suitable for use in many applications of conventional volatile memory devices, such as dynamic random-access memory (DRAM) devices. Such thin-film storage transistors also have an advantage of a retention time in minutes, rather than milliseconds, as typical of conventional DRAM devices. Therefore, one may refer to the thin-film storage transistors of the '015 Publication as quasi-volatile storage transistors. In many applications, such a quasi-volatile storage transistor should preferably have a high endurance (e.g., in the range of $10^{11}$ cycles) and may preferably be programed or erased using voltages of about 8-9 volts or lower.

Fast programming and fast erase operations require relatively high currents through the gate stack of the storage transistor. FIG. 1 is an energy band diagram of a portion of a storage transistor, which includes multiple sublayers of dielectric materials and stores charge between a channel region and a gate electrode. As shown in FIG. 1, various materials 120 between channel region 110 and gate electrode 114 allow data storage in the storage transistor. These materials include tunnel dielectric sublayer 111, charge-trapping sublayer 112 (e.g., silicon nitride) and blocking dielectric sublayer 113 (e.g., silicon oxide). Charge-trapping sublayer 112 and blocking dielectric sublayer 113 may each be, for example, 4 nm thick. In FIG. 1, line 101 traces the lowest energy states in the conduction bands of the various materials and line 102 traces the highest energy states in the valence bands of the various materials. In such a system, to change the threshold voltage of the storage transistor by one volt in 100 ns requires a programming current density of about 5.0 amps/cm$^2$. Using silicon dioxide as tunneling dielectric sublayer 111, such a high current density may be achieved at a moderate electric field in the range of 10.0 MV/cm through a direct tunneling mechanism.

FIG. 2 shows, in one example, direct tunneling current densities (gate currents) for various silicon dioxide thicknesses under different bias conditions. As shown in FIG. 2, the desired high current density (e.g., 5.0 amps/cm$^2$) may be achieved in silicon dioxide for thicknesses less than 1.5 nm, even for voltages below 1.5 volts across the silicon dioxide layer.

FIGS. 3(a) and 3(b) illustrate, respectively, direct tunneling of electrons into charge-trapping sublayer 112 and out of charge-trapping sublayer 112 during programming and erase operations. As illustrated in FIG. 3(a), the applied programming voltage across gate electrode 114 and channel region 110 lowers the conduction bands of tunnel dielectric sublayer 111, charge-trapping sublayer 112 and blocking dielectric sublayer 113 relative to channel region 110. Specifically, the lowest energy levels in the conduction bands of sites in charge-trapping sublayer 112 are lowered to slightly below that of channel region 110 to allow electrons with energy at the lowest energy levels of the conduction band in channel region 110 to direct-tunnel into charge-trapping sublayer 112, as illustrated by arrow 301 in FIG. 3(a).

Likewise, as illustrated in FIG. 3(b), the applied erase voltage across gate electrode 114 and channel region 110 raises the lowest energy levels in the conduction bands of tunnel dielectric sublayer 111, charge-trapping sublayer 112 and blocking dielectric sublayer 113 relative to those of channel region 110. The electric field imparts energy to electrons at the allowed energy levels of the charge-trapping sites in charge-trapping sublayer 112 to direct tunnel into channel region 110, as illustrated by arrow 302 in FIG. 3(b).

The direct tunneling mechanisms by electrons illustrated in FIGS. 3(a) and 3(b) allow fast programming and erase. In contrast, erasing by holes is a slow mechanism. In a floating-substrate quasi-volatile storage cell (e.g., a thin-film storage transistor disclosed in the '015 Publication), for example, holes in channel region 110 are insufficient to provide an adequate hole current into charge-trapping sublayer 112; the likely erase mechanism for such a storage transistor pulls electrons out from charge-trapping sublayer 112.

In a storage transistor, the voltage difference between the threshold voltages of the storage transistor in the erased state and in the programmed state is referred to as the "programming window." The programming window narrows or closes with the number of cycles the storage transistor has been programmed and erased. Such programming window narrowing is due to, for example, degradation at the interface between channel region 110 and tunnel dielectric 111, as a result of interface states formation. Programming window narrowing may also result from charge-trapping at other material interfaces, e.g., between charge-trapping sublayer 112 and blocking dielectric sublayer 113. The endurance of a storage transistor refers to the number of program-erase cycles before the storage transistor fails to maintain an acceptable programming window. As illustrated in FIG. 3(a), electrons that direct tunnel from channel region 110 to charge-trapping sublayer 112 have low energy entering charge-trapping sublayer 112, so that they give up only a small amount of energy settling in the lowest allowed energy states in charge-trapping sublayer 112 (i.e., the lowest energy levels in the conduction bands of channel region 110 and charge-trapping sublayer 112 are very close in the presence of the programming voltage). This energy loss does not cause any appreciable damage to charge-trapping sublayer 112. In contrast, as illustrated in FIG. 3(b), the energy loss by electrons entering channel region 110 during an erase operation is significantly larger. The greater energy loss generates energetic holes ("hot holes") in channel region 110, which would be driven by the electric field of the erase voltage towards gate electrode 114. These hot holes create interface traps at the interface between channel region 110 and tunnel dielectric sublayer 111. These interface traps are detrimental to the endurance of the storage transistor and, in fact, may be primarily responsible for the programming window closing. One of ordinary skill in the art may also recognize that the hot holes phenomenon, known as the "anode hot hole injection mechanism," provides one model for dielectric breakdown.

FIG. 4 illustrates the evolution of the programming window in a storage transistor over more than $10^9$ program and erase cycles, showing program state threshold voltage 401 and erase state threshold voltage 402.

Furthermore, multi-film layers ("stacks"), e.g., silicon oxide-silicon nitride-silicon oxide (ONO) stacks and silicon oxide-silicon nitride-silicon oxide-aluminum oxide (ONOA) stacks, are used in gate dielectric layers of storage transistors in many memory applications. For such applications, electrons or holes are transported by a tunneling mechanism through a thin dilectric film (e.g., silicon oxide) of the stack into charge-trapping sites in the stack; this thin dielectric film is typically referred to as the tunnel dielectric layer. The charge-trapping sites are typically provided in an adjacent film (e.g., silicon nitride) of the stack, typically referred to as the charge trap layer. The films in the stack on the other side of the charge trap layer (e.g., silicon oxide or silicon oxide-aluminum oxide) are typically referred to as the blocking layer or layers. The blocking layer of stack is designed to allow none or minimal charge tunneling.

When an ONO or ONOA stack is used as a gate dielectric layer in a storage transistor, the threshold voltage of such a transistor is determined by the amount of charge tunneled into the charge trap layer. In a memory application, the amount of charge in the charge trap layer is varied, so as to set different threshold voltages—hence, different programmed or erased states—in the storage transistor.

SUMMARY

According to one embodiment of the present invention, a thin-film storage transistor in a NOR memory string has a gate dielectric layer that includes a silicon oxide nitride (SiON) tunnel dielectric layer. In one embodiment, the SiON tunnel dielectric layer has a thickness between 0.5 to 5.0 nm thick and an index of refraction between 1.5 and 1.9. The SiON tunnel dielectric layer may be deposited at between 720° C. and 900° C. and between 100 and 800 mTorr vapor pressure, using an LPCVD technique under DCS, $N_2O$, and $NH_3$ gas flows. The SiON tunnel dielectric layer may have a nitrogen content of 1-45 atomic percent (at %).

According to another embodiment of the present invention, a storage transistor has a tunnel dielectric layer and a charge-trapping layer between a channel region and a gate electrode, wherein the charge-tapping layer has a conduction band offset—relative to a n-type silicon conduction band—that is less than the lowering of the tunneling barrier in the tunnel dielectric layer when a programming voltage is applied, such that electrons direct tunnel into the charge-trapping layer. The conduction band offset of the charge-trapping layer is selected to have a value between −1.0 eV and 2.3 eV. In some embodiments, the charge-tapping layer may include one or more of: hafnium oxide ($HfO_2$), yttrium oxide ($Y_2O_3$), silicon nitride ($Si_3N_4$), zirconium oxide ($ZrO_2$), zirconium silicon oxide ($ZrSiO_4$), lanthanum oxide ($La_2O_3$) tantalum oxide ($Ta_2O_5$), cerium oxide ($CeO_2$), titanium oxide ($TiO_2$), strontium titanium oxide ($SrTiO_3$), other semiconductors, and metal nanodots (e.g., silicon, ruthenium, platinum and cobalt nanodots).

According to one embodiment of the present invention, the storage transistor may further include a barrier layer between the tunnel dielectric layer and the charge-trapping layer, the barrier layer having a conduction band offset less than the conduction band offset of the charge-trapping layer. The barrier layer may also include a material having a conduction band offset between −1.0 eV and 2.3 eV, preferably between −1.0 eV to 1.5 eV, such as one or more of: hafnium oxide ($HfO_2$), yttrium oxide ($Y_2O_3$), silicon nitride ($Si_3N_4$), zirconium oxide ($ZrO_2$), zirconium silicon oxide ($ZrSiO_4$), tantalum oxide ($Ta_2O_5$), cerium oxide ($CeO_2$), titanium oxide ($TiO_2$), strontium titanium oxide ($SrTiO_3$), other semiconductors, and metal nanodots (e.g., silicon, ruthenium, platinum and cobalt nanodots).

In one embodiment, when a voltage substantially less than the programming voltage is applied across the channel region and the gate electrode, electrons tunnel into the charge-trapping layer by the Fowler-Nordheim turnneling mechanism through an energy barrier that is wider than the thickness of the tunnel dielectric layer.

In one embodiment, the tunnel dielectric layer may be as thin as 5.0-40.0 Å and may be formed out of silicon oxide (e.g., $SiO_2$), silicon nitride (SiN), silicon oxynitride (SiON), or a combination of these materials. A silicon oxide tunnel dielectric layer may be formed using conventional oxidation techniques (e.g., a high-temperature oxidation), chemical synthesis (e.g., atomic layer deposition (ALD)), or any suitable combination of these techniques. A reactive $O_2$ process may include ozone for a precisely controlled thickness and an improved oxide quality (e.g., reduced leakage due to defect sites). A silicon nitride tunnel dielectric layer may be formed using conventional nitridation, direct synthesis, chemical synthesis (e.g., by atomic layer deposition), or any suitable combination of these techniques. A plasma process may be used for a precisely controlled thickness and an improved dielectric quality (e.g., reduced leakage due to defect sites).

The tunnel dielectric layer may also include in addition a thin aluminum oxide ($Al_2O_3$) layer (e.g., 10 Å or less). The aluminum oxide layer in the tunnel dielectric layer may be synthesized in the amorphous phase, to reduce leakage due to defect sites.

The present invention is better understood upon consideration of the detailed description below in conjunction with the accompanying drawings.

BRIEF DESCRIPTION OF THE DRAWINGS

FIG. 5 is an energy band diagram in an exemplary storage transistor having channel region 501, tunnel dielectric layer 502 and charge-trapping layer 503.

FIGS. 6(a), 6(b) and 6(c) show, respectively, (i) the lowest energy levels of the conduction bands at substrate 501, tunnel dielectric 502 and charge-trapping layer 503 of a storage transistor; (ii) the lowest energy levels in the conduction bands of these layers of the storage transistor without application of a voltage; and (iii) the electron energy offset 515 between substrate 501 and charge-trapping layer 503, when an erase voltage is applied.

FIGS. 7(a), 7(b) and 7(c) show, respectively, (i) the relative conduction band offsets at substrate 601, tunnel dielectric 602, low conduction band offset (LCBO) barrier layer 603, and charge-trapping layer 604 of a storage transistor; (ii) an energy band diagram of these layers of the storage transistor without application of a voltage; and (iii) electron energy offset 615 between substrate 601 and charge-trapping layer 604, when an erase voltage is applied.

FIGS. 10(a) and 10(b) are band diagrams for the structure during programming and erase operations, based on a one-volt drop across tunnel dielectric layer 602 (i.e., b=1 eV, during a programming operation and b'=1 eV, during an erase operation).

DETAILED DESCRIPTION OF THE PREFERRED EMBODIMENTS

Figure 1:
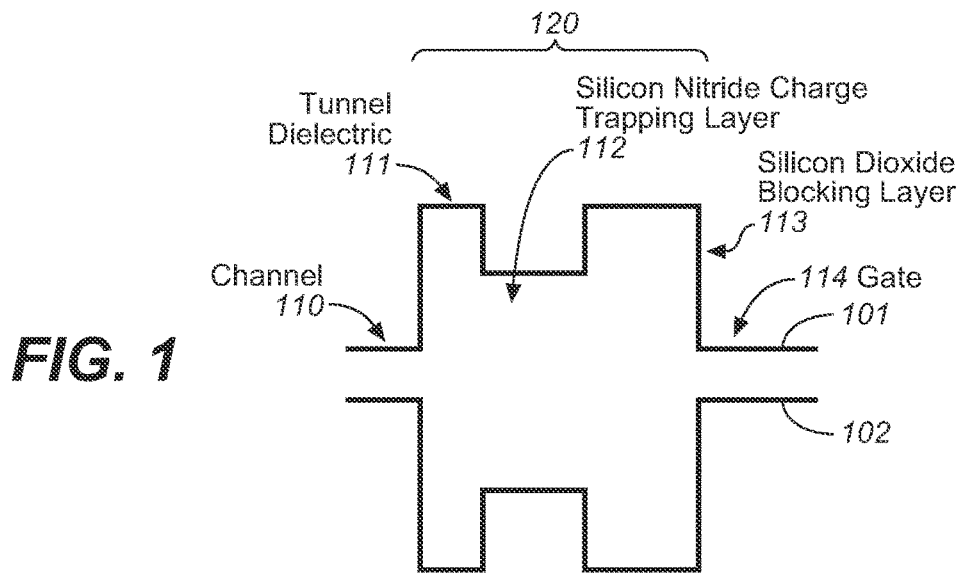
FIG. 1 is an energy band diagram of a conventional storage transistor, which includes multiple sublayers of dielectric materials and stores charge between a channel region and a gate electrode.
Figure 2:
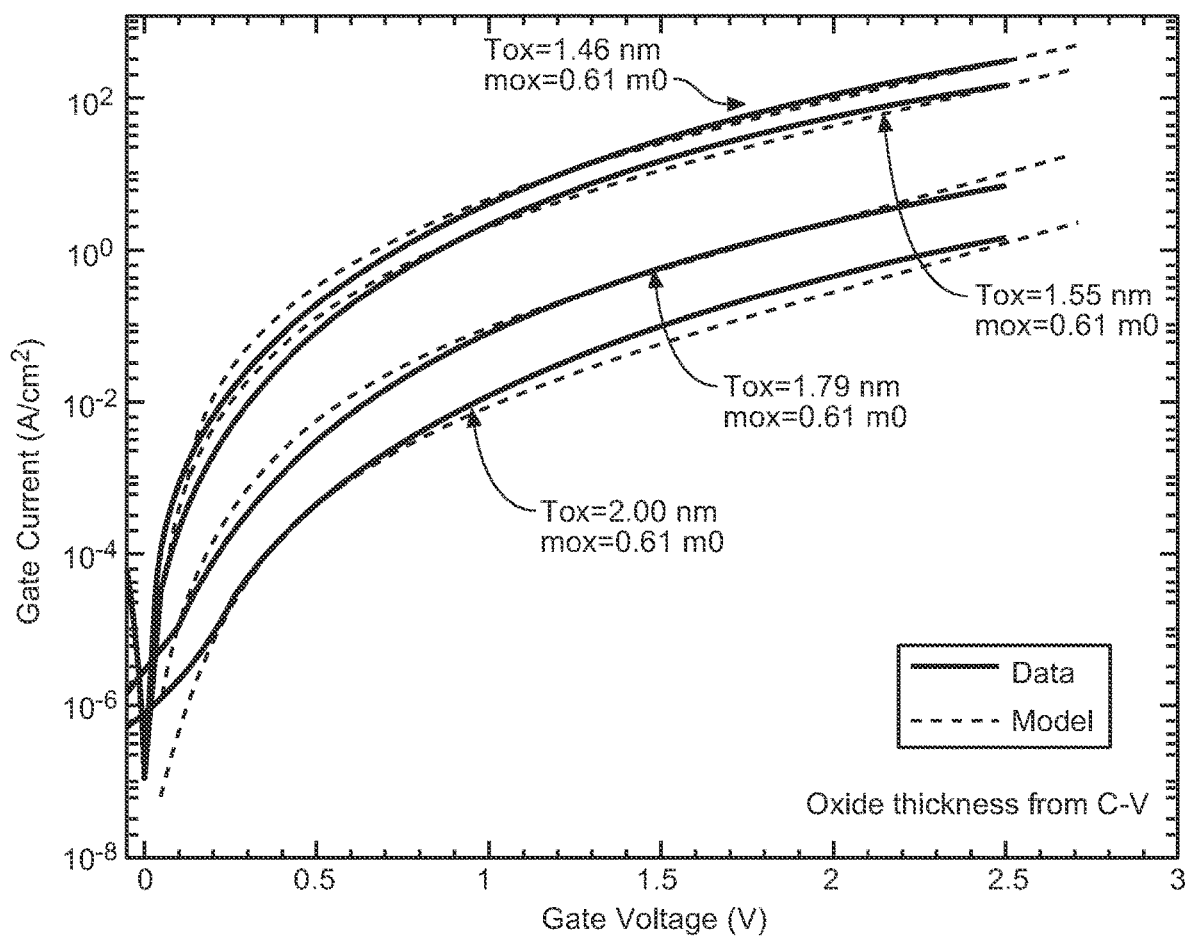
FIG. 2 shows some typical direct tunneling current densities (gate currents) for various silicon dioxide thicknesses under different bias conditions.
Figure 3B:
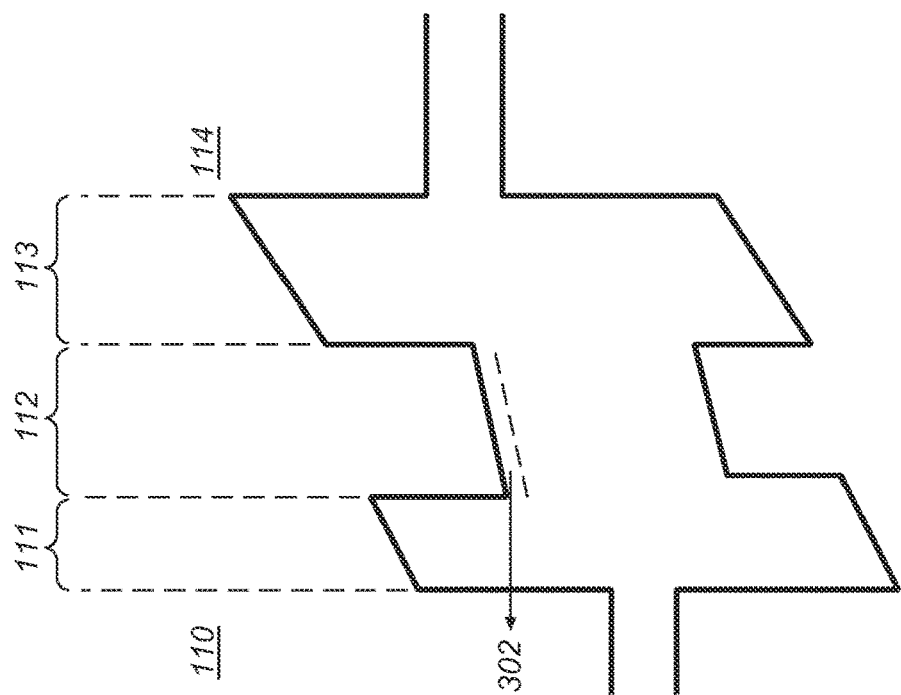
FIGS. 3(a) and 3(b) illustrate, respectively, direct tunneling of electrons into charge-trapping sublayer 112 and out of charge-trapping sublayer 112 during programming and erase operations.
Figure 3A:
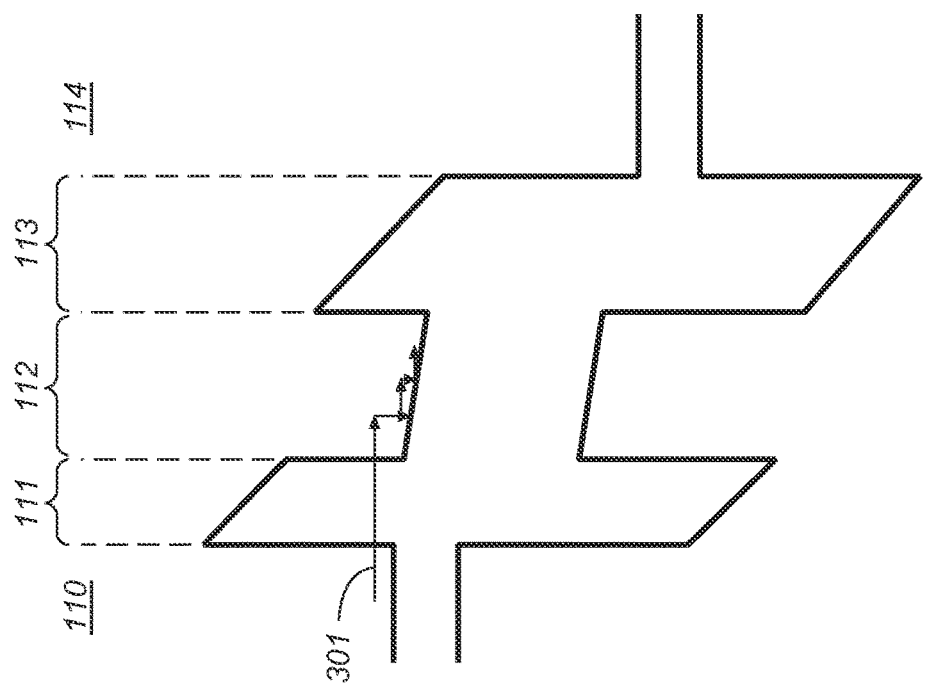
Figure 4:
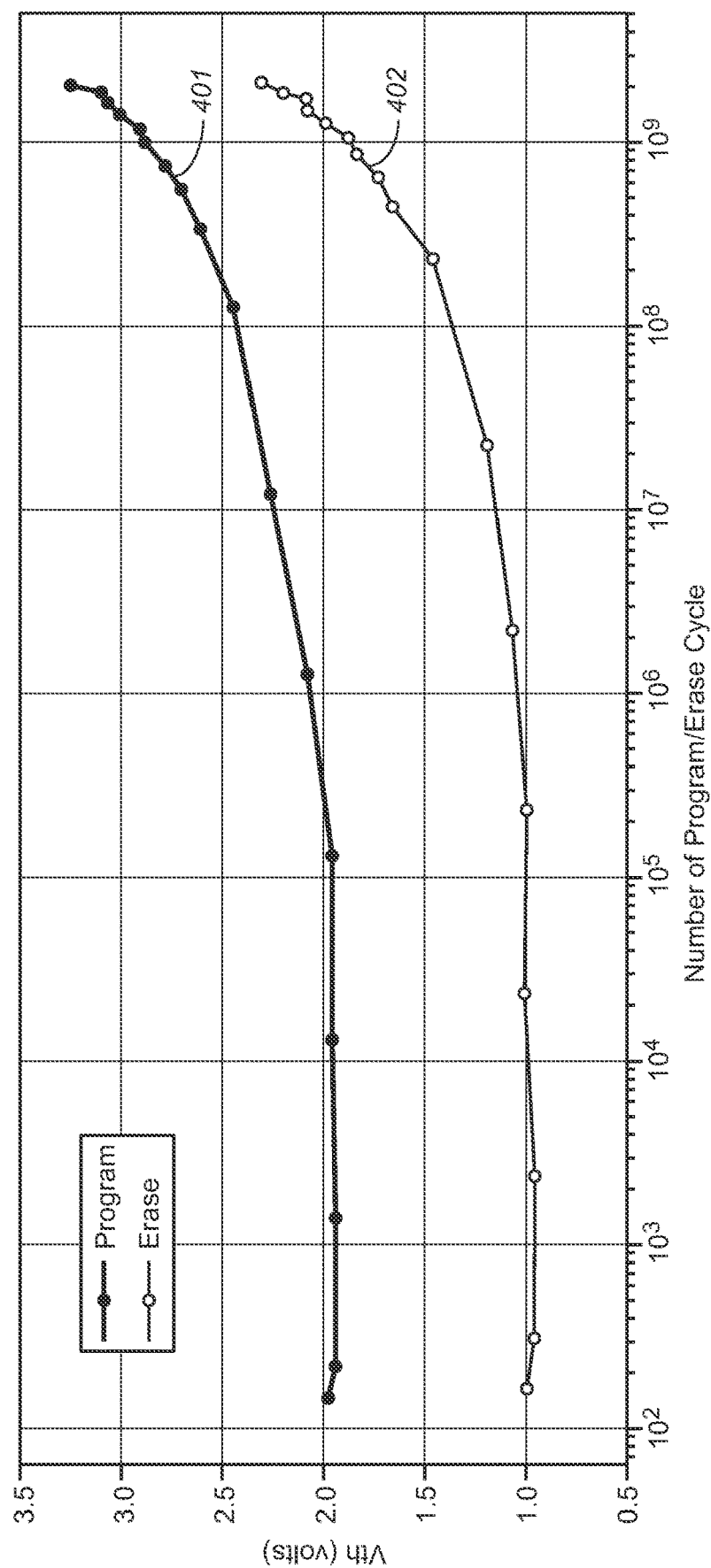
FIG. 4 illustrates an evolution of the programming window in a storage transistor over more than $10^9$ program and erase cycles, showing program state threshold voltage 401 and erase state threshold voltage 402.

The present invention improves endurance in a storage transistor to exceed $10^{11}$ program-erase cycles using a device structure that ensures electrons tunneling out of a charge-trapping layer into the channel region of the storage transistor (e.g., during an erase operation) are within a desirable low energy range ("cool electrons"), such that any resulting hole generations are also low-energy and are thus less damaging to the programming window. The device structure provides a substantial direct tunneling programming current density exceeding 1.0 amps/cm$^2$ (e.g., 5.0 amps/cm$^2$). The present invention is particularly advantageous for use in storage layers of thin-film storage transistors that are formed in 3-dimensional memory structures, such as those quasi-volatile storage transistors in the 3-dimensional arrays of NOR memory strings disclosed in the '015 Publication discussed above.

One embodiment of the present invention is illustrated by the model of FIG. 5, showing the conduction and valence energy band boundaries 511 and 512 of an exemplary storage transistor having channel region 501, tunnel dielectric layer 502 and charge-trapping layer 503. As FIG. 5 illustrates, arrow 514 represents electrons direct tunnel from charge-trapping layer 503 to channel region 501. The energy difference ("conduction band offset") between the lowest energy levels in the conduction bands of charge-trapping layer 503 and channel region 501—indicated by reference numeral 515—is the expected energy loss by an electron so tunneled.

The present invention may be achieved by judiciously selecting a combination of materials for a tunnel dielectric material and a charge-trapping dielectric material, to obtain desirable conduction band offsets at these layers relative to the semiconductor substrate (i.e., the channel region) of the storage transistor. FIG. 6(a) shows the lowest energy levels of the conduction bands at substrate 501, tunnel dielectric 502 and charge-trapping layer 503 of the storage transistor. FIG. 6(b) shows the lowest energy levels in the conduction bands of these layers of the storage transistor without application of a voltage. FIG. 6(c) shows the electron energy offset 515 between substrate 501 and charge-trapping layer 503, when an erase voltage is applied. Electron energy offset 515 depends on conduction band offsets between substrate 501 and each of tunnel dielectric layer 502 and charge-trapping layer 503, as well as on the voltage applied for the erase operation. As illustrated in FIG. 6(c), for tunnel dielectric layer 502, using different charge-trapping materials as charge-trapping layer 503, with different conduction band offsets relative to the substrate layer 501, results in greater or lesser energy loss in the tunneling electrons reaching substrate 501. Likewise, for charge-trapping layer 503, using different tunnel dielectric materials as tunnel dielectric layer 502, with different conduction band offsets relative to the substrate layer 501, also results in greater or lesser energy loss in the tunneling electrons reaching substrate 501.

Tunnel dielectric layer 502 may be as thin as 5.0-4.0 Å and may be formed out of silicon oxide (e.g., $SiO_2$), silicon nitride (SiN), silicon oxynitride (SiON), or a combination of these materials. A silicon oxide tunnel dielectric layer may be formed using conventional oxidation techniques (e.g., a high-temperature oxidation), chemical synthesis (e.g., atomic layer deposition (ALD)), or any suitable combination of these techniques. A reactive $O_2$ process may include an ozone step (e.g., using pulsed ozone) for a precisely controlled thickness and an improved oxide quality (e.g., reduced leakage due to defect sites). The ozone step augments solidification of the oxide in a conformal manner, which is particularly advantageous for three-dimensional transistor structures. An annealing step (e.g., an $H_2$ anneal, a $NH_3$ anneal, or a rapid thermal annealing) may also fortify tunnel dielectric layer 502. A silicon nitride tunnel dielectric layer may be formed using conventional nitridation, direct synthesis, chemical synthesis (e.g., by ALD), or any suitable combination of these techniques. A plasma process may be used for a precisely controlled thickness and an improved dielectric quality (e.g., reduced leakage due to defect sites).

Tunnel dielectric layer 502 may also include an additional thin aluminum oxide ($Al_2O_3$) layer (e.g., 10 Å or less). This additional aluminum oxide layer in the tunnel dielectric layer may be synthesized in the amorphous phase, to reduce leakage due to defect sites.

The following materials may be used to provide tunnel dielectric layer 502 and charge-trapping layer 503:

| Material | Conduction Band Offset |
|---|---|
| Silicon oxide ($SiO_2$) | 3.15 eV |
| Hafnium oxide ($HfO_2$) | 1.5 eV |
| Silicon Nitride ($Si_3N_4$) | 2.4 eV |
| Yttrium oxide ($Y_2O_3$) | 2.3 eV |
| Zirconium oxide ($ZrO_2$) | 1.4 eV |
| Zirconium silicon oxide ($ZrSiO_4$) | 1.5 eV |
| Lanthanum oxide ($La_2O_3$) | 2.3 eV |
| Silicon oxinitrides (SiN:H) | 1.3-2.4 eV |
| Tantalum oxide ($Ta_2O_5$) | 0.3 eV |
| Cerium oxide ($CeO_2$) | 0.6 eV |
| Titanium oxide ($TiO_2$) | 0.0 eV |
| Strontium titanium oxide ($SrTiO_3$) | 0.0 eV |
| Silicon-rich silicon nitride (SiN:Si) | 1.35 eV |
| Silicon nanodots | 0.0 eV |
| Ruthenium nanodots | −0.7 eV |
| Cobalt nanodots | −1.0 eV |

Using a lower conduction band offset in the charge-trapping layer provides an effective increase in tunneling barrier in the tunnel dielectric layer, resulting in improved data retention.

Alternatively, a barrier material of low conduction band offset may be introduced into the storage transistor between the tunnel dielectric layer and the charge-trapping layer. FIGS. 7(a)-7(c) are band diagrams representative of such a structure. FIG. 7(a) shows the relative conduction band offsets at substrate 601, tunnel dielectric 602, low conduction band offset barrier dielectric 603 and charge-trapping layer 604 of the storage transistor. FIG. 7(b) is an energy band diagram of these layers of the storage transistor without application of a voltage. FIG. 7(c) shows the electron energy offset 615 between substrate 601 and charge-trapping layer 604, when an erase voltage is applied. Electron energy offset 615 depends on conduction band offsets between substrate 601 and each of tunnel dielectric layer 602, low conduction band offset barrier layer 603 and charge-trapping layer 604, as well as on the voltage applied for the erase operation. As shown in FIGS. 7(a)-7(c), low conduction band offset (LCBO) barrier dielectric 603 preferably has a conduction band offset relative to substrate 601 that is lower than those of both tunnel dielectric layer 602 and charge-trapping layer 604. Judiciously choosing the materials for tunnel dielectric layer 602, LCBO barrier layer 603, and trapping layer 604, cool electron direct tunneling may be achieved for both program and erase operations, resulting in a high endurance in the storage transistor.

Figure 8A:
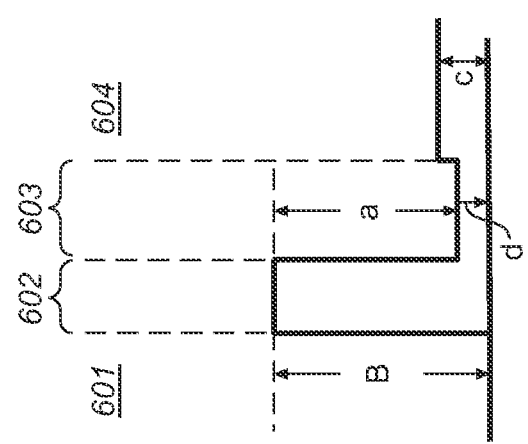
FIGS. 8(a), 8(b) and 8(c) illustrate the conduction band offset parameters for dielectric layers 602-604 illustrated in FIGS. 7(a)-7(c).
Figure 8B:
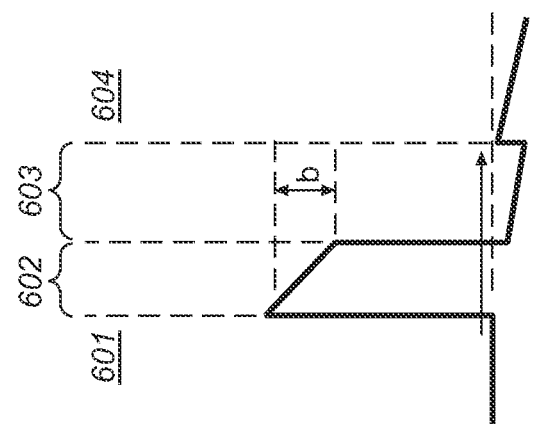
Figure 8C:
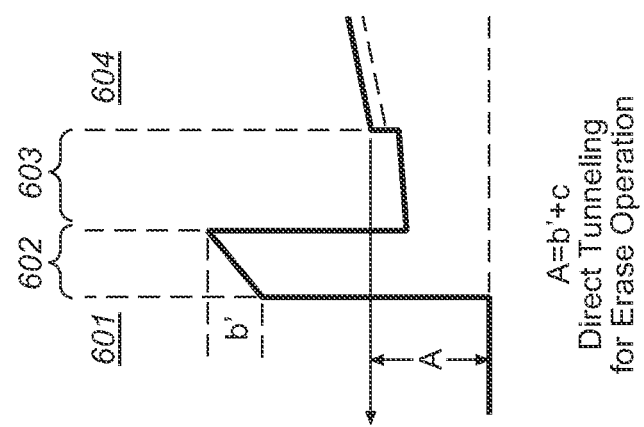

FIGS. 8(a)-(c) illustrate the conduction band offset parameters for dielectric layers 602-604 illustrated in FIGS. 7(a)-7(c). As shown in FIG. 8(a), (i) parameter B represents the conduction band offset of tunnel dielectric layer 602 relative to substrate 601, (ii) parameter a represents the conduction band offset of LCBO barrier layer 603 relative to the conduction band offset of tunnel dielectric layer 602, (iii) parameter d represents the conduction band offset of LCBO barrier layer 603 relative to substrate 601, and (iv) parameter c represents the conduction band offset of charge-trapping layer 604 relative to substrate 601. According to one embodiment of the present invention, the conduction band offset of LCBO barrier layer 603 should not be greater than the conduction band offset of charge-trapping layer 604 (i.e., d≤c) to allow a substantial direct tunneling programming current density exceeding 1.0 amps/cm² (e.g., 5.0 amps/cm²).

FIG. 8(b) shows sloping of the energy level at the bottom of the conduction band of tunnel dielectric layer 602 as a result of the programming voltage. The sloping lowers the energy level of tunnel dielectric layer 602 by parameter b over the thickness of tunnel dielectric layer 602. For the programming operation to be effectuated by direct tunneling, the value of parameter b should be greater or equal to the value of parameter c (i.e., b≥c). The value of parameter b (in eV units) is the product of the voltage drop across tunnel dielectric layer 602 and the electron charge q (i.e., $1.6 \times 10^{-19}$ coulombs).

When the voltage drop across tunnel dielectric 602 is less than the conduction band offset of charge-trapping layer 604 (i.e., b'c), the tunneling barrier becomes wider, as at least a part of LCBO barrier layer 603 remains a tunneling barrier. In that case, direct tunneling may give way to a modified Fowler-Nordheim (MFN) mechanism, which provides a much smaller current than direct tunneling (e.g., less than 0.1 amps/cm²).

Figure 9C:
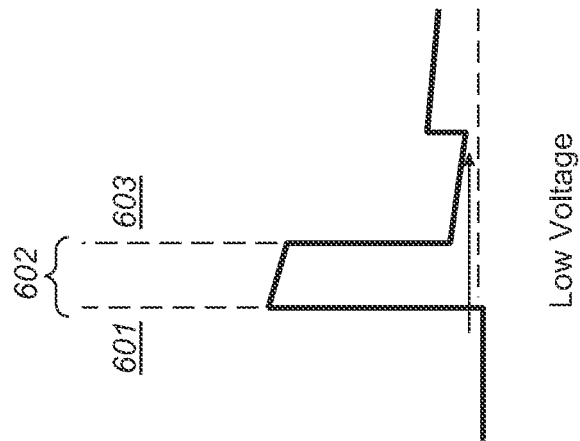
FIG. 9(a) illustrates direct tunneling and FIGS. 9(b) and 9(c) illustrate MFN tunneling in the storage transistor of FIGS. 7(a)-7(c).
Figure 9B:
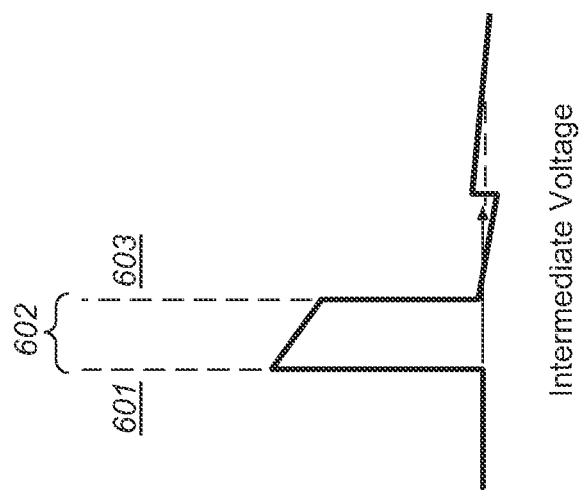
Figure 9A:
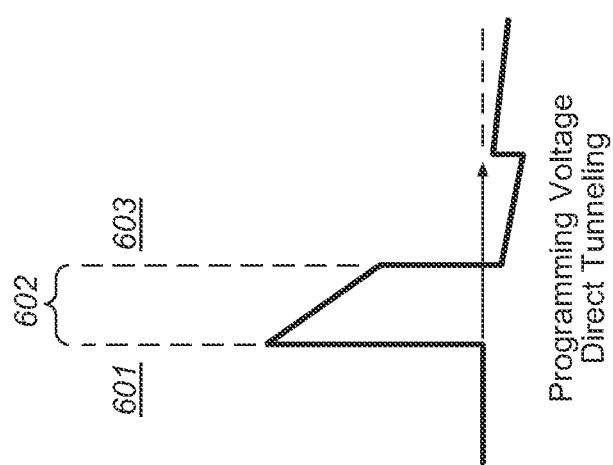

FIG. 9(a) illustrates direct tunneling, under application of a programming voltage, and FIGS. 9(b) and 9(c) illustrate MFN tunneling, under a lower voltage ("intermediate") and an even lower voltage, respectively, in the storage transistor of FIGS. 7(a)-7(c). One may recognize that MFN tunneling may occur in a region of low voltage disturbs during operations of the storage transistor. However, for a storage transistor having the structure illustrated in FIGS. 7(a)-7(c), this MFN tunneling current can be very low for a range of voltages applied. The materials and the thicknesses for charge-trapping layer 604 and barrier layer 603 are selected such that read disturb voltages, programming inhibit voltages or erase inhibit voltages fall within the range of low or intermediate voltages that restrict tunneling to the MFN mechanism.

Thus, the storage transistor of the present invention provides an important advantage: high currents at the programming voltage due to direct tunneling, while having merely a low MFN tunneling current when exposed to a low voltage. This characteristic reduces disturbs during read, programming inhibit, or erase inhibit operations and improves data retention and endurance, particularly in quasi-volatile storage transistors of the present invention that use direct tunneling for fast programming and fast erase operations. In this regard, LCBO barrier layer 603 improves endurance by enabling cool electron-erase operations, which reduces device degradation, as the resulting holes generated in the channel region are low-energy.

By restricting tunneling at low voltages to MFN tunneling, LCBO barrier layer 603 also improve data retention and reduces read disturb, programming-inhibit disturbs and erase-inhibit disturbs, as the read disturbs, programming-inhibit disturbs and erase-inhibit disturbs all occur at low voltages. For example, programming-inhibit disturbs and erase-inhibit disturbs occur at half-select or a lower voltage than that used in the respective programming and erase operations. All these benefits accrue in the storage transistors biased at low voltages, while at the same time maintaining the advantages of the high efficiency of direct tunneling accrue in the storage transistors biased at the higher read, programming or erase voltages.

FIG. 8(c) shows sloping of the energy level at the bottom of the conduction band of tunnel dielectric layer 602 during an erase operation. The sloping raises the energy level of tunnel dielectric layer 602 by parameter b' over the thickness of tunnel dielectric layer 602. During the erase operation, electrons in direct tunneling from charge-trapping layer 604 to substrate 601 loses an energy represented by parameter A, which is given by: A=b'+c. Note that the conduction band offset of charge-trapping layer 604 should be greater than the amount by which the energy level of a charge-trapping site is below the conduction band of charge-trapping layer 604 in order for the electrons at the charge-trapping site to be included in the direct tunneling current.

According to one embodiment of the present invention, substrate 601 may be implemented by a P-doped silicon, tunnel dielectric layer 602 may be implemented by a 1-nm thick $SiO_2$ layer (B=3.15 eV), low conduction band offset barrier layer 603 may be implemented by a 2-nm thick $Ta_2O_5$ layer (d=0.3 eV), charge-trapping layer 604 may be implemented by a 4-nm thick silicon-rich silicon nitride (i.e., SiN:Si; c=1.35 eV), and another 4-nm thick $SiO_2$ layer may be used to provide a blocking dielectric layer. Unlike silicon nitride (stoichiometrically, $Si_3N_4$), silicon-rich silicon nitride includes silicon as impurity, which reduces silicon nitride's band gap from 4.6 eV to about 3.6 eV for silicon-rich silicon nitride. Also, silicon nitride has a refractive index of 2.0, while silicon-rich silicon nitride has a refractive index in the range of 2.1-2.3. Gate electrode 606 may be implemented by a highly-doped P-type polysilicon. FIGS. 10(a) and 10(b) are band diagrams for the structure during programming and erase operations, based on a one-volt drop across tunnel dielectric layer 602 (i.e., b=1 eV, during a programming operation and b'=1 eV, during an erase operation). As shown in FIG. 10(b), as indicated by arrow 1001, an electron reaching substrate 601 by direct tunneling loses about 1.4 eV of energy during the erase operation. Scattering in LCBO barrier layer 603, as indicated by arrow 1002, may further reduce this energy loss.

According to another embodiment of the present invention, substrate 601 may be implemented by a P-doped silicon, tunnel dielectric layer 602 may be implemented by a 1-nm thick $SiO_2$ layer (B=3.15 eV), low conduction band offset barrier layer 603 may be implemented by a 2-nm thick $CeO_2$ layer (d=0.6 eV), charge-trapping layer 604 may be implemented by a 4-nm thick silicon-rich silicon nitride (i.e., $Si_3N_{r4}$:Si; c=1.35 eV), and another 5-nm thick $SiO_2$ layer may be used to provide a blocking dielectric layer (e.g., blocking dielectric layer 605). Gate electrode 606 may be implemented by a highly-doped P-type polysilicon.

FIG. 11(a)-11(d) show various simulation results for storage transistors of the present invention.

Figure 11A:
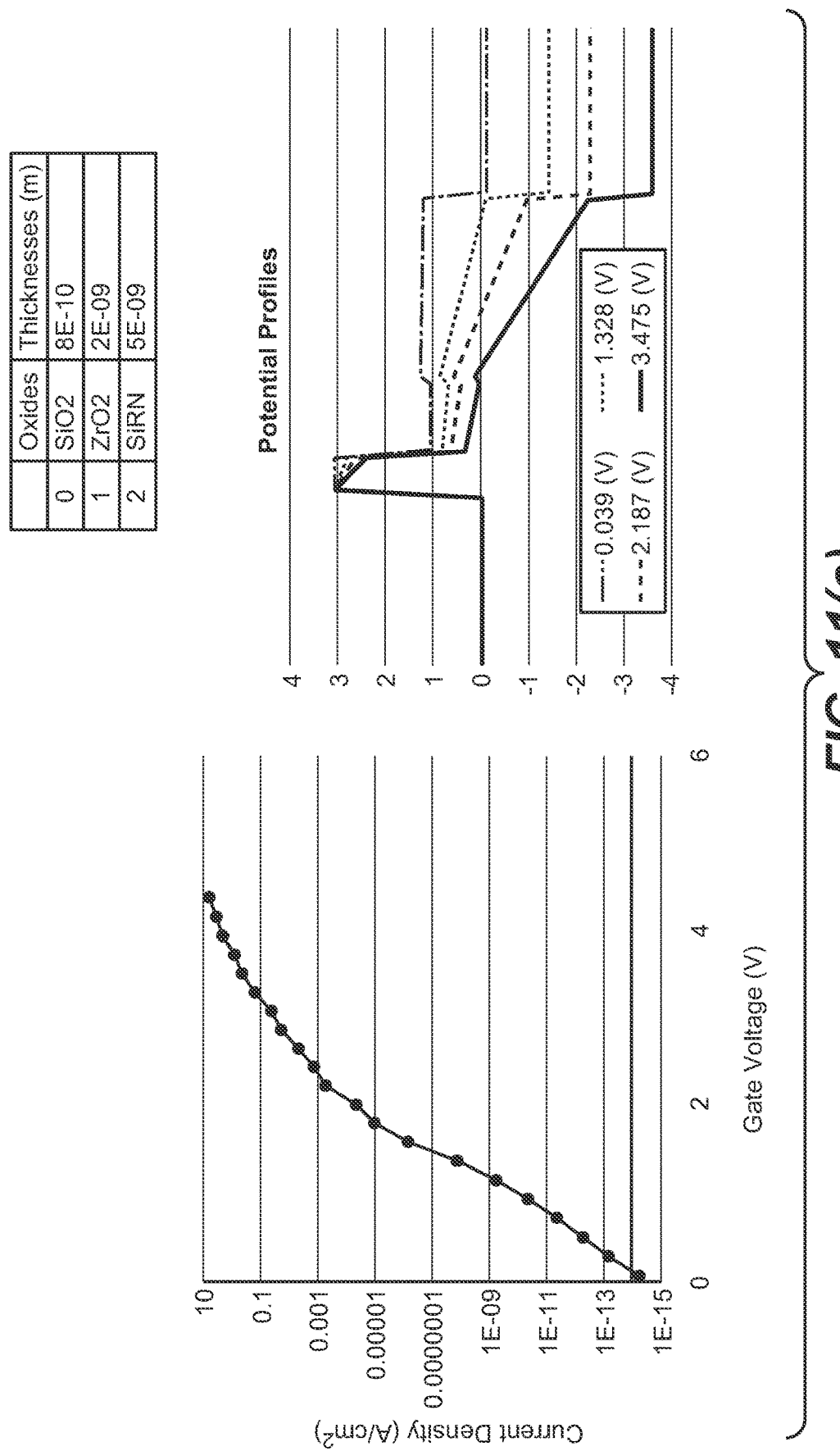
FIGS. 11(a), 11(b), 11(c) and 11(d) show various simulation results for storage transistors of the present invention.

FIG. 11(a) shows a simulation of a storage transistor having a 0.8 nm thick silicon oxide tunneling dielectric layer, a 2.0 nm thick zirconium oxide LCBO barrier layer and a 5.0 nm thick silicon-rich silicon nitride trapping layer. FIG. 11(a) shows that a direct-tunneling current density exceeding 1.0 amps/cm² is achieved with a programming voltage around 3.1 volts.

Figure 11B:
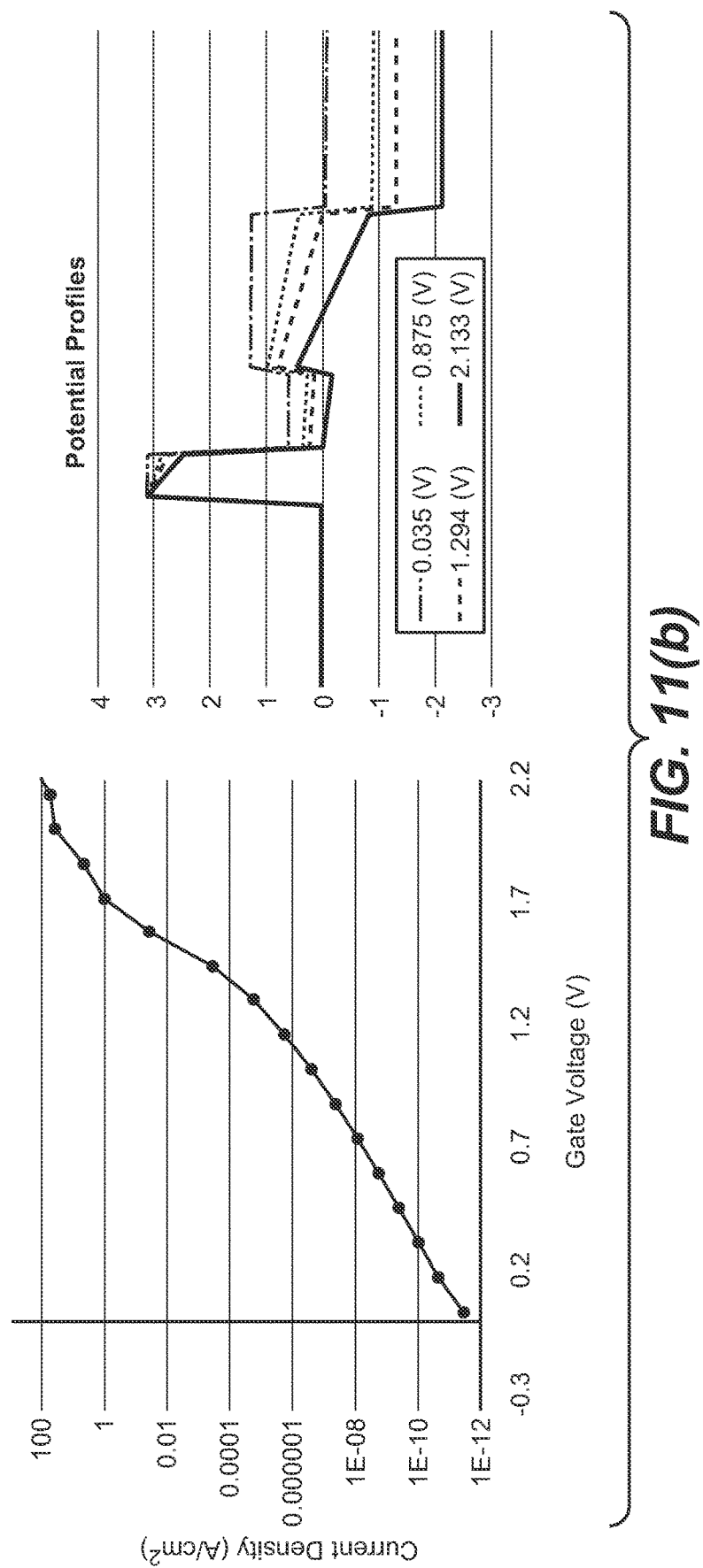

FIG. 11(b) shows a simulation of a storage transistor having a 1.0 nm thick silicon oxide tunneling dielectric layer, a 2.0 nm thick cerium oxide LCBO barrier layer and a 4.0 nm thick silicon-rich silicon nitride trapping layer. FIG. 11(b) shows that a direct-tunneling current density exceeding 1.0 amps/cm² is achieved with a programming voltage around 1.6 volts.

Figure 11C:
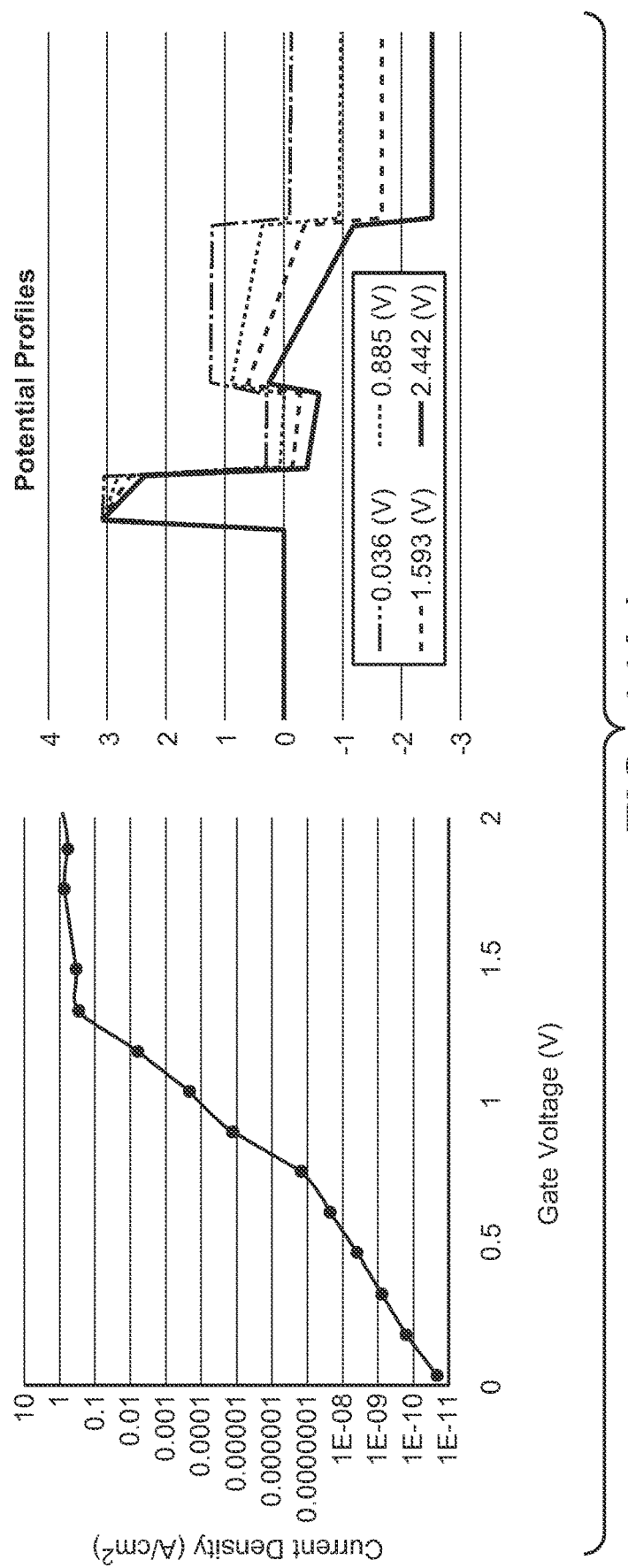

FIG. 11(c) shows a simulation of a storage transistor having a 1.0 nm thick silicon oxide tunneling dielectric layer, a 2.0 nm thick tantalum oxide LCBO barrier layer and a 4.0 nm thick silicon-rich silicon nitride trapping layer. FIG. 11(c) shows that a direct-tunneling current density exceeding 1.0 amps/cm² is achieved with a programming voltage around 1.8 volts.

Figure 11D:
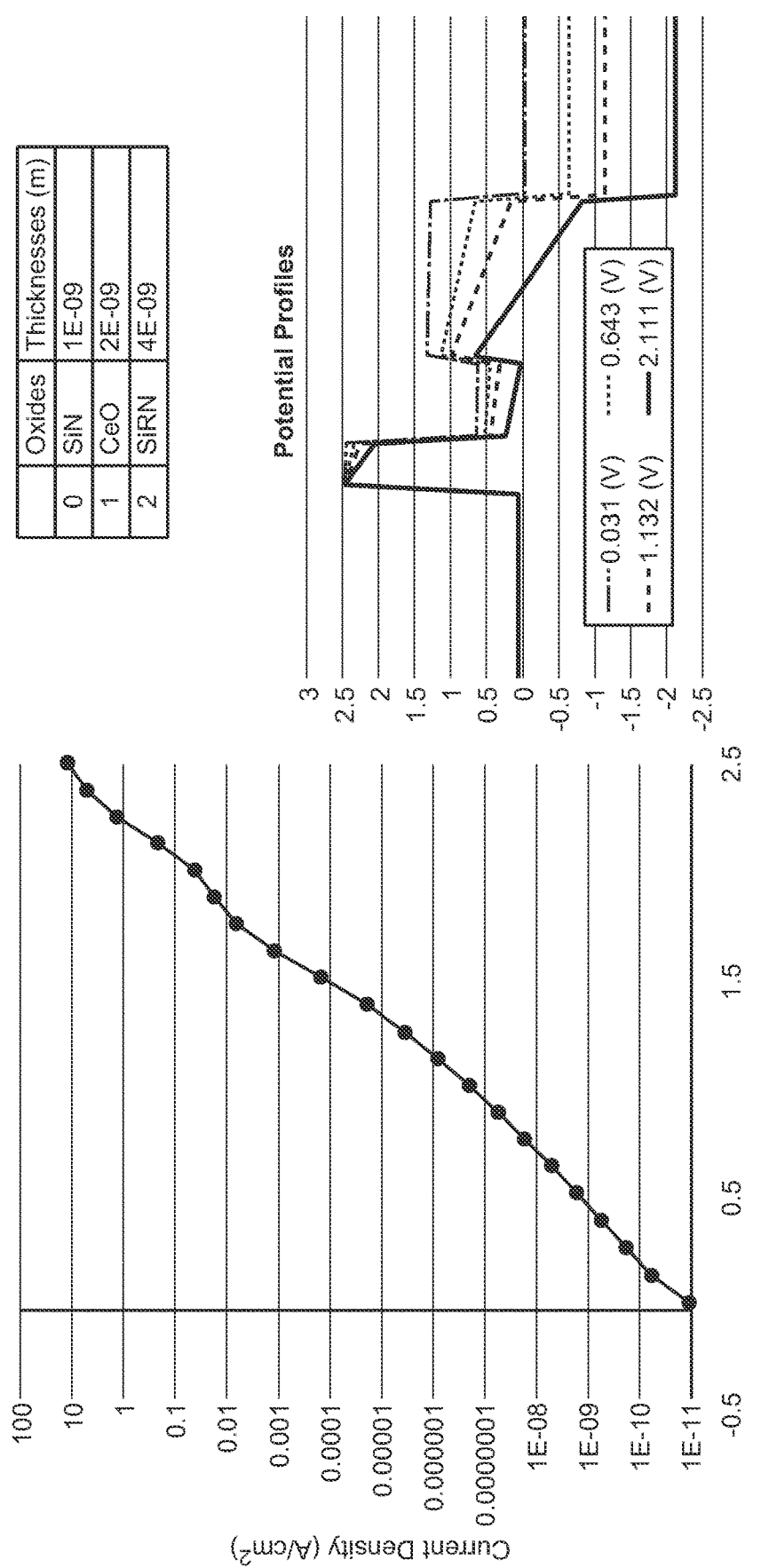

FIG. 11(d) shows a simulation of a storage transistor having a 1.0 nm thick silicon nitride tunneling dielectric layer, a 2.0 nm thick cerium oxide LCBO barrier layer and a 4.0 nm thick silicon-rich silicon nitride trapping layer. FIG. 11(d) shows that a direct-tunneling current density exceeding 1.0 amps/cm² is achieved with a programming voltage around 2.1 volts.

Figure 12B:
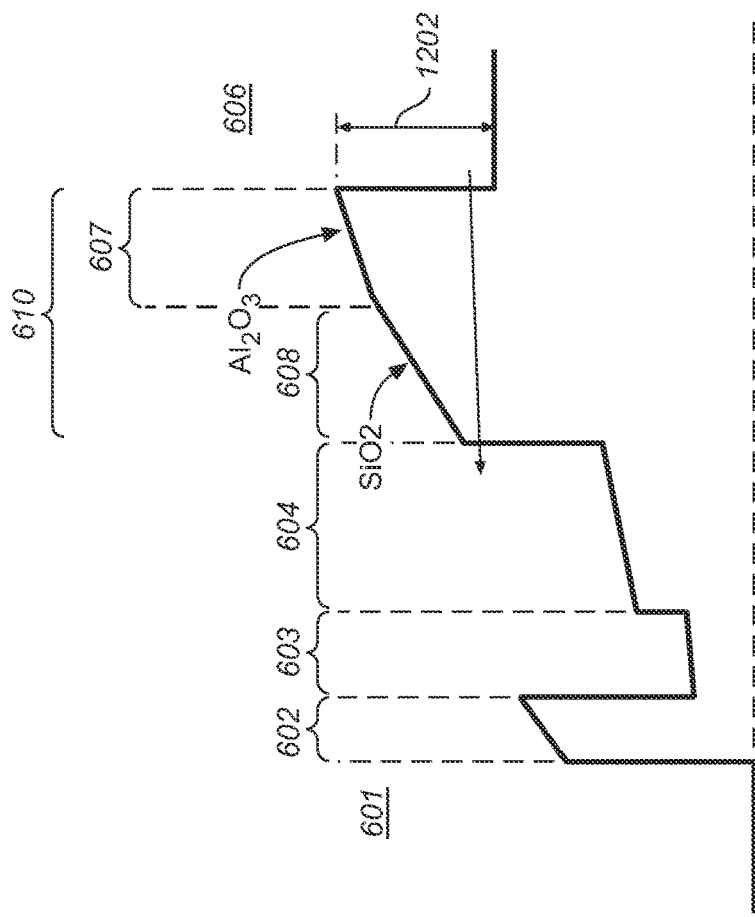
FIG. 12(b) is an energy band diagram for the conduction band of a gate stack of a storage transistor during an erase operation, the storage transistor having additional aluminum oxide layer 607 in blocking dielectric layer 610, according to one embodiment of the present invention.
Figure 12A:
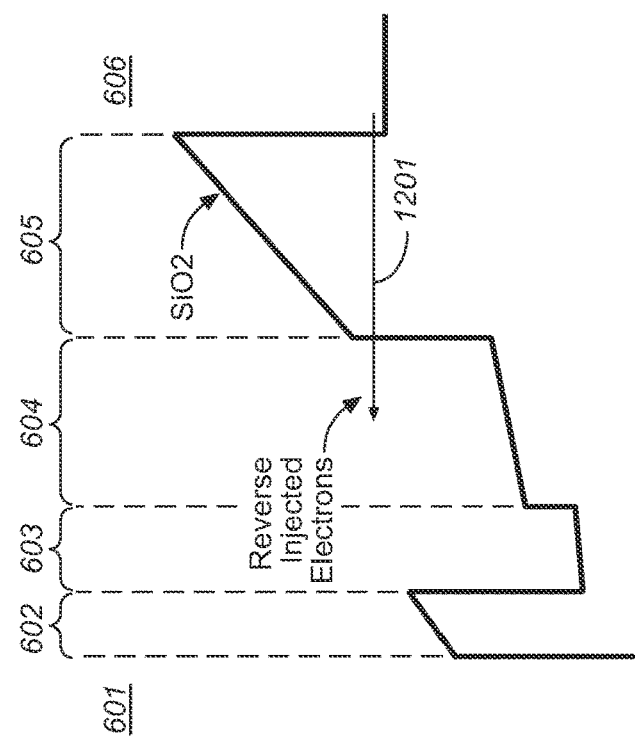
FIG. 12(a) is an energy band diagram for the conduction band of a gate stack of a storage transistor during an erase operation.

FIG. 12(a) illustrates a "reverse injection electrons" phenomenon that may occur during an erase operation. The reverse injection electrons may affect endurance adversely. FIG. 12(a) is an energy band diagram for the conduction band of a gate stack in a storage transistor during an erase operation. As shown in FIG. 12(a), the gate stack includes substrate 601, tunnel dielectric 602, LCBO barrier dielectric 603, charge-trapping layer 604, blocking dielectric layer 605 and gate electrode 606. (Blocking dielectric layer 605 may be, for example, silicon oxide ($SiO_2$)). During an erase operation, the relatively high electric field across blocking dielectric layer 605 may cause high-energy electrons—indicated in FIG. 12(a) by arrow 1201—to tunnel from the gate electrode into charge-trapping layer 604, or even into tunnel dielectric layer 602. These reverse injection electrons may damage these layers, adversely affecting the storage transistor's endurance.

According to one embodiment of the present invention, reverse injection electrons may be significantly reduced or substantially eliminating by including a layer of material with a high dielectric constant ("high-k material"), such as aluminum oxide ($Al_2O_3$) in the blocking dielectric layer (e.g., blocking dielectric layer 605 of FIG. 10(a)). In that embodiment, a high work function metal (e.g., greater than 3.8 eV, preferably not less than 4.0 eV) may be used for gate electrode. A high-k material of $t_H$ provides an equivalent oxide thickness $t_{EOT}$ given by:

$$t_{EOT} = t_H \times \frac{K_{ox}}{K_H}$$

where $K_{ox}$ and $K_H$ are the relative dielectric constants of silicon oxide and the high-k material, respectively. Thus, a high-k material can provide the same desirable transistor characteristics (e.g., gate capacitance) at a thickness of $t_H$, without incurring undesirable leakage of its silicon oxide layer counterpart at the much thinner equivalent thickness $t_{EOT}$.

FIG. 12(b) is an energy band diagram for the conduction band of a gate stack in a storage transistor during an erase operation, the storage transistor having additional aluminum oxide layer 607 in blocking dielectric layer 610, according to one embodiment of the present invention. In FIG. 12(b), blocking dielectric layer 610 includes aluminum oxide layer 607 and silicon oxide layer 608. In one implementation, blocking dielectric layer 610 has an equivalent oxide thickness that is substantially the same as blocking layer dielectric 605 of FIG. 12(a). However, as aluminum oxide has a relative dielectric constant of 9.0, while silicon oxide's relative dielectric constant is 3.9, the actual combined physical thickness of aluminum oxide 607 and silicon oxide 608 in FIG. 12(b) is greater than the thickness of blocking dielectric layer 605 of FIG. 12(a). Because high-k dielectric layer 607 has a greater relative dielectric constant than silicon oxide layer 608, the electric field is lower in high-k dielectric layer 607 than in silicon oxide layer 608. The greater combined physical thickness of blocking dielectric layer 610 of FIG. 12(b)—which provides a wider tunneling barrier between gate electrode 606 and charge-trapping layer 604—and a lower electric field at the interface between gate electrode 606 and high-k material 607 reduce or eliminate reverse injection electrons, thereby resulting in an improved endurance. With high-k electric layer 607 (e.g., aluminum oxide), a high work function metal is preferred for gate electrode 606. The high work function metal creates a high barrier (indicated by barrier height 1202 in FIG. 12(b)) at the gate electrode-aluminum oxide interface, which significantly reduces reverse electron injection the erase operation. Suitable high work function metals include: tungsten (NV), tantalum nitride (TaN), tantalum silicon nitride (TaSiN).

Figure 13:
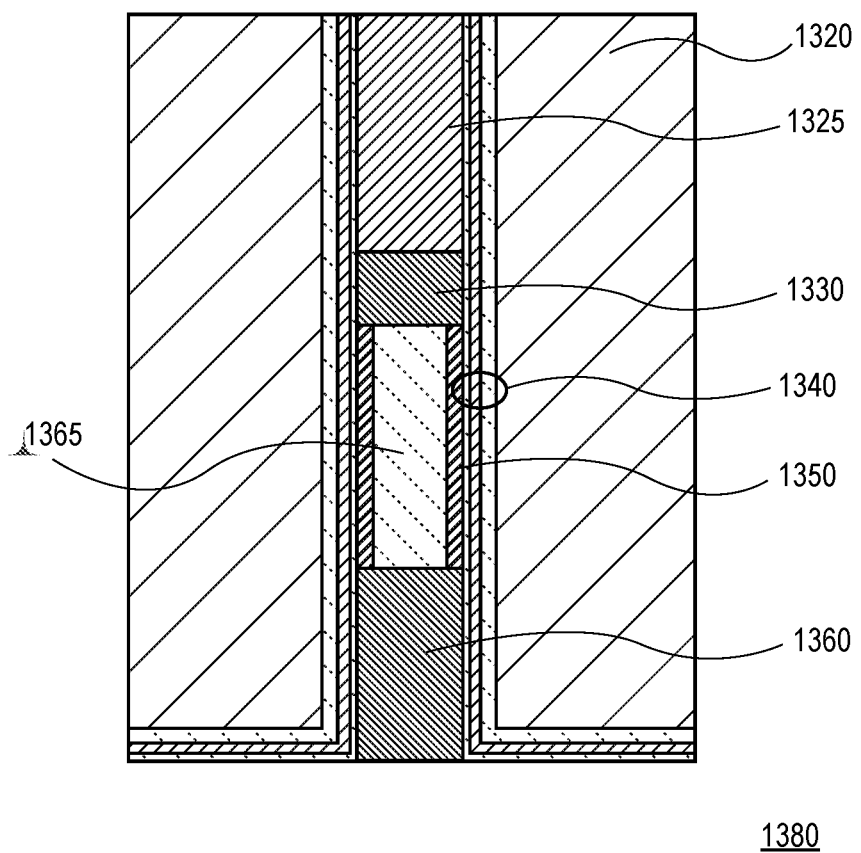
FIG. 13 shows a cross section view of storage transistor 1300 in a NOR memory string.

According to another embodiment of the present invention, FIG. 13 is a cross-sectional view of thin-film storage transistor 1300 in a NOR memory string. As shown in FIG. 13, storage transistor 1300 includes drain region 1360, channel region 1350, source region 1330, gate dielectric layer 1340 and gate electrode 1320. In one embodiment, drain region 1360 and source region 1330 may be relatively heavily-doped n⁺ semiconductor films (e.g., polysilicon), while channel region 1350 may be a relatively lightly-doped p⁻ semiconductor film (e.g., polysilicon). Storage transistor 1300 may be part of a NOR memory string that extends along a direction orthogonal to the cross section. The storage transistors in the NOR memory string share in common drain region 1360 and source region 1330. In FIG. 13, channel region 1350 is provided on opposite sides of oxide layer 1365. In one embodiment, the materials of drain region 1360, oxide layer 1365 and source region 1330 are successively deposited as thin-films, one atop another, above a planar surface of semiconductor substrate 1380. The material layers are then photolithographically patterned and etched to create trenches that divide the material layers into multiple multi-film structures. Storage transistor 1300 results from further processing of one of the multi-film structures. Oxide layer 1365 of each multi-film structure is then recessed from the sidewalls of the multi-film structure, whereupon channel layer 1350 may be deposited into the recessed cavities in the sidewalls. In FIG. 13, only one NOR memory string is provided in each multi-film structure. However, in a 3-dimensional NOR memory string array, multiple NOR memory strings may be provided in each multi-film structure, one atop of another, with each NOR memory string being isolated from another in the multi-film structure by an interlayer dielectric (ILD) layer (e.g., ILD layer 1325). Storage transistor 1300 is substantially formed after conformal deposition of gate dielectric layer 1340, followed by deposition of trench-filling gate electrode 1320. Gate electrode 1320 may be a relatively heavily-doped p⁺ semiconductor (e.g., polysilicon) film, a metal or any suitable conductive material.

As described above, gate dielectric layer 1340 may be formed using an ONO stack or an ONOA stack, each having a tunnel dielectric layer, a charge trap layer and one or more blocking layers. The tunnel dielectric layer is preferably very thin (e.g., less than 3.0 nm, if provided by a silicon oxide layer), so as to allow direct tunneling of charge carriers through the tunnel dielectric layer to the charge trap layer. With such a thin tunnel dielectric layer, charge accumulates ("programs") or depletes ("erases") very rapidly from the charge trap layer. A programming operation accumulates sufficient charge carriers in the charge trap layer until a predetermined threshold voltage change is effectuated ("programmed state") in the storage transistor. The reverse operation, i.e., depleting charge carriers from the charge trap layer, is complete when the same threshold voltage change is effectuated ("erased state") in the opposite direction.

For some applications, it is advantageous for the programming and erase operations to complete within the storage transistor 1300 as quickly as possible. In general, a thinner tunnel dielectric layer enables a faster programming or erasing operation, as a thinner tunnel dielectric layer represents a lower energy barrier for charge accumulation or depletion from the charge trap layer. However, even though a thin tunnel dielectric layer is beneficial for a faster programming or erase operation, a thin tunnel dielectric layer is detrimental for charge retention in the charge trap layer. A thinner tunnel dielectric layer facilitates charge leakage from the charge trap layer. (Charge retention in a memory cell may be characterized by a "retention time," being the time period over which a predetermined fraction of the charge of the programmed state is leaked away from the charge trap layer.)

Another key characteristic of a storage transistor in a NOR memory string is its endurance. Endurance may be characterized by the number of program and erase cycles the storage transistor can endure, while maintaining predetermined key characteristics (e.g., threshold voltages) of the programmed and erased states. For example, in one embodiment, the threshold voltage for the programmed state is 2.5±0.5 volts, while the threshold voltage for the erased state may be 1.0±0.5 volts. The goal is for the storage transistor to maintain within its endurance these threshold voltage ranges in their programmed and erased states.

The program and the erase voltages used to achieve the programmed and the erased states, respectively, affect both endurance and the durations of the programming and the erase operations. In general, increasing the programming and the erase voltages reduces the required durations of the respective programming and erase operations. This relationship is beneficial. At the same time, however, increasing the program and erase voltages undesirably reduces the endurance of the storage transistor. In addition, smaller drive transistors may be used for providing the lower programming and erase voltages, which allows a desirable reduced chip size and a lower "cost-per-bit."

According to one embodiment of the present invention, a silicon oxide nitride (SiON) tunnel dielectric film is used for the tunnel dielectric layer of multi-film gate dielectric layer 1340. For example, gate dielectric layer 1340 may have a SiON tunnel dielctric layer, a silicon nitride charge trap layer and either a silicon oxide blocking layer or a composite silicon oxide and aluminum oxide blocking layer. The inventors have discovered that, relative to a silicon oxide tunnel dielectric layer of comparable thickness, the SiON tunnel dielectric layer provides superior performance for a storage transistor in a NOR memory string, such as faster programming and erase operations, lower programming and erase voltages, and greater endurance. In this detailed description, a SiON film refers to any $SiO_xN_y$ film, where the values of x and y may each be a value between 0.01 and 0.99. Thus, SiON is also referred to in this detailed description as silicon oxynitride.

The inventors compared the performances of two multi-film layers or stacks used as gate dielectric layer 1340: one with a 1.2 nm silicon oxide tunnel dielectric layer, and the other one with a 1.2 nm SiON tunnel dielectric layer. The remainder films in each stack are: a 5-nm silicon nitride charge trap layer and a 5-nm silicon oxide blocking layer. The tunnel dielectric layers are each formed using low pressure chemical vapor deposition (LPCVD). The silicon oxide tunnel dielectric layer is deposited at 755° C. and at a 300 mTorr vapor pressure, under dichlorosilane (DCS) and nitrous oxide ($N_2O$) gas flows. The SiON tunnel dielectric layer is deposited at 755° C. and 350 mTorr vapor pressure, under DCS, $N_2O$, and ammonia ($NH_3$) gas flows. By varying the ratio of $N_2O$ to $NH_3$, the relative amounts of oxygen or nitrogen in the SiON tunnel dielectric layer may be varied. The composition of the SiON tunnel dielectric layer is estimated using its index of refraction. The indices of refraction of silicon oxide and silicon nitride are, respectively, approximately 1.46 and approximately 2.0, such that an SiON film is expected to have an index of refraction between 1.46 and 2.0.

In one embodiment, the SiON tunnel dielectric layer has an index of refraction of approximately 1.7. The 1.2-nm SiON tunnel dielectric layer with an index of refraction of approximate 1.7 was deposited using an $N_2O$ to $NH_3$ gas flow ratio of about 4. The inventors have determined that a suitable range of thickness for such SiON tunnel dielectric layer in a storage transistor of a NOR memory string should be between 0.5 to 5.0 nm, with an index of refraction between 1.5 and 1.9, deposited between 720° C. and 900° C. and between 100 and 800 mTorr vapor pressure, using an LPCVD technique under DCS, $N_2O$, and $NH_3$ gas flows. A thin film that has in its composition more than one element (e.g., a SiON film discussed herein has a composition that includes silicon, oxygen and nitrogen) may be characterized by the atomic percentage or at % of each of its elements. For example, a silicon dioxide ($SiO_2$) film with a refractive index (n) of 1.46 may be characterized by its 66.67 at % oxygen and 33.33 at % silicon. Similarly, a silicon nitride ($Si_3N_4$) film with a refractive index of 2.0 is characterized by its 57.1 at % nitrogen. For the SiON tunnel dielectric layer with a refractive index of 1.7 discussed herein, it may be characterized by its approximate composition of $SiO_{0.5}N_{0.5}$ or 25 at % nitrogen, as reported, for example, in the article, "Deposition and Composition Of Silicon Oxynitride Films," by A. E. T. Kuiper et al., Journal of Vacuum Science and Technology B; Microelectronics Processing and Phenomenon, vol. 1, No. 1, (January-March 1983), pp. 62-66.

The inventors discovered that the median programming pulses (i.e., comparable voltage and duration) required for achieving a desired programming window (i.e., a 1.0 volts voltage difference between the threshold voltages of the "programmed" and "erased" states) are comparable (e.g., within 0.1 volts) in storage transistors using a SiON tunnel dielectric layer, relative to storage transistors using a silicon oxide tunnel dielectric layer of equal thickness. However, a substantially lower median erase voltage (in magnitude) may be used to achieve the "erased" state of the same programming window in storage transistors using a SiON tunnel dielectric layer, relative to storage transistors using a silicon oxide tunnel dielectric layer of equal thickness. In one instance, a difference of 1.6 volts was observed between the erase voltage with a silicon oxide tunnel dielectric layer and the erase voltage with a SiON tunnel dielectric layer.

The inventors have determined that, for a storage transistor having a SiON tunnel dielectric layer of the present invention, a high-endurance window of operation (e.g., 1.0-2.0 volts difference between programmed and erased states) may be achieved using a programming voltage of about 8.0 volts and an erase voltage of about −8.0 volts. In one instance, the inventors found that the window of operation remains open beyond $10^{11}$ program-erase cycles. The inventors surmise that lower programming and erase voltages may further improve endurance in the SiON tunnel dielectric layer.

The detailed description above is provided to illustrate specific embodiments of the present invention and is not intended to be limiting. Numerous variations and modifications within the scope of the present invention are possible. The present invention is set forth in the accompanying claims.

We claim:

1. A storage transistor having a tunnel dielectric layer within the gate dielectric layer, wherein the tunnel dielectric layer comprises both a silicon oxide nitride (SiON) layer and an amorphous-phase aluminum oxide ($Al_2O_3$) layer, wherein the storage transistor further comprises a charge-trapping layer having a conduction band offset that is less than the lowering of the tunneling barrier in the tunnel dielectric layer when a programming voltage is applied, such that electrons direct tunnel into the charge-trapping layer.

2. The storage transistor of claim 1, wherein the storage transistor is a storage transistor in a NOR memory string.

3. The storage transistor of claim 1, wherein the SiON layer has a thickness between approximately 0.5 nm to approximately 5.0 nm.

4. The storage transistor of claim 1, wherein the SiON layer is approximately 1.2 nm thick.

5. The storage transistor of claim 1, wherein the SiON layer has an index of refraction between approximately 1.46 and approximately 2.0.

6. The storage transistor of claim 1, wherein the SiON layer has an index of refraction between approximately 1.5 and approximately 1.9.

7. The storage transistor of claim 1, wherein the SiON layer has an index of refraction between and inclusive of approximately 1.6 to 1.7.

8. The storage transistor of claim 1, wherein the gate dielectric layer further comprises a charge trap layer and a blocking layer.

9. The storage transistor of claim 1, wherein the SiON layer is deposited at between approximately 720° C. and 900° C.

10. The storage transistor of claim 1, wherein the SiON layer is deposited at between 100 and 800 mTorr vapor pressure.

11. The storage transistor of claim 1, wherein the SiON layer is deposited at approximately 755° C. and 350 mTorr vapor pressure.

12. The storage transistor of claim 1, wherein the SiON layer is deposited under dichlorosilane (DCS), nitrous oxide ($N_2O$), and ammonia ($NH_3$) gas flows.

13. The storage transistor of claim 12, wherein the SiON layer is deposited under an $N_2O$ to $NH_3$ gas flow ratio of about 4:1.

14. The storage transistor of claim 1, wherein the SiON layer is deposited using a lower-power chemical vapor deposition (LPCVD) technique.

15. The storage transistor of claim 1, wherein the SiON layer has a nitrogen content of 1-45 atomic percent (at %).

16. The storage transistor of claim 1, wherein the SiON layer has a greater oxygen content relative to nitrogen content.

17. The storage transistor of claim 1, wherein the conduction band offset of the charge-trapping layer is between −1.0 eV and 2.3 eV.

18. The storage transistor of claim 1 wherein the $Al_2O_3$ layer is 10.0 nm or less thick.

* * * * *